United States Patent
Bauser

(10) Patent No.: US 7,957,206 B2
(45) Date of Patent: Jun. 7, 2011

(54) READ CIRCUITRY FOR AN INTEGRATED CIRCUIT HAVING MEMORY CELLS AND/OR A MEMORY CELL ARRAY, AND METHOD OF OPERATING SAME

(75) Inventor: Philippe Bauser, Sauverny (FR)

(73) Assignee: Micron Technology, Inc., Boise, ID (US)

( * ) Notice: Subject to any disclaimer, the term of this patent is extended or adjusted under 35 U.S.C. 154(b) by 291 days.

(21) Appl. No.: 12/080,642

(22) Filed: Apr. 4, 2008

(65) Prior Publication Data
US 2009/0251958 A1 Oct. 8, 2009

(51) Int. Cl.
G11C 7/00 (2006.01)
(52) U.S. Cl. .............. 365/189.15; 365/174; 365/189.07; 365/189.09; 365/203; 365/204; 365/233.17; 365/242
(58) Field of Classification Search .................. 365/174, 365/189.15, 189.07, 189.09, 203, 204, 233.17, 365/242
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |

(Continued)

FOREIGN PATENT DOCUMENTS

CA 272437 7/1927

(Continued)

OTHER PUBLICATIONS

"Memory Design Using a One-Transistor GainCell on SOI", IEEE Journal of Solid-State Circuits, vol. 37, No. 11, Nov. 2002, Ohsawa et al., pp. 1510-1522.

(Continued)

*Primary Examiner* — Amir Zarabian
*Assistant Examiner* — Fernando N Hidalgo
(74) *Attorney, Agent, or Firm* — Hunton & Williams LLP

(57) ABSTRACT

An integrated circuit device (e.g., a logic device or a memory device) having a memory cell array which includes (i) a plurality of memory cells, wherein each memory cell is programmable to store one of a plurality of data states, and (ii) a bit line, having a plurality of memory cells coupled thereto. Memory cell control circuitry applies one or more read control signals to perform a read operation wherein, in response to the read control signals, a selected memory cell conducts a current which is representative of the data state stored therein. Sense amplifier circuitry senses the data state stored in the selected memory cell using a signal which is responsive to the current conducted by the selected memory cell. Current regulation circuitry is responsively and electrically coupled to the bit line during a portion of the read operation to sink or source at least a portion of the current provided on the bit line. Sensing circuitry responsively couples the current regulation circuitry to the bit line during the portion of the read operation.

24 Claims, 20 Drawing Sheets

U.S. PATENT DOCUMENTS

| | | | |
|---|---|---|---|
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |

| | | | | | | |
|---|---|---|---|---|---|---|
| 7,301,838 | B2 | 11/2007 | Waller | 2006/0098481 A1 | 5/2006 | Okhonin et al. |
| 7,317,641 | B2 | 1/2008 | Scheuerlein | 2006/0126374 A1 | 6/2006 | Waller et al. |
| 7,324,387 | B1 | 1/2008 | Bergemont et al. | 2006/0131650 A1 | 6/2006 | Okhonin et al. |
| 7,335,934 | B2 | 2/2008 | Fazan | 2006/0223302 A1 | 10/2006 | Chang et al. |
| 7,341,904 | B2 | 3/2008 | Willer | 2007/0008811 A1 | 1/2007 | Keeth et al. |
| 7,416,943 | B2 | 8/2008 | Figura et al. | 2007/0023833 A1 | 2/2007 | Okhonin et al. |
| 7,456,439 | B1 | 11/2008 | Horch | 2007/0045709 A1 | 3/2007 | Yang |
| 7,477,540 | B2 | 1/2009 | Okhonin et al. | 2007/0058427 A1 | 3/2007 | Okhonin et al. |
| 7,492,632 | B2 | 2/2009 | Carman | 2007/0064489 A1* | 3/2007 | Bauser .................. 365/185.21 |
| 7,517,744 | B2 | 4/2009 | Mathew et al. | 2007/0085140 A1 | 4/2007 | Bassin |
| 7,539,041 | B2 | 5/2009 | Kim et al. | 2007/0097751 A1 | 5/2007 | Popoff et al. |
| 7,542,340 | B2 | 6/2009 | Fisch et al. | 2007/0114599 A1 | 5/2007 | Hshieh |
| 7,542,345 | B2 | 6/2009 | Okhonin et al. | 2007/0133330 A1 | 6/2007 | Ohsawa |
| 7,545,694 | B2* | 6/2009 | Raghavan et al. ............ 365/207 | 2007/0138524 A1 | 6/2007 | Kim et al. |
| 7,606,066 | B2 | 10/2009 | Okhonin et al. | 2007/0138530 A1 | 6/2007 | Okhonin et al. |
| 7,696,032 | B2 | 4/2010 | Kim et al. | 2007/0187751 A1 | 8/2007 | Hu et al. |
| 2001/0055859 | A1 | 12/2001 | Yamada et al. | 2007/0187775 A1 | 8/2007 | Okhonin et al. |
| 2002/0030214 | A1 | 3/2002 | Horiguchi | 2007/0200176 A1 | 8/2007 | Kammler et al. |
| 2002/0034855 | A1 | 3/2002 | Horiguchi et al. | 2007/0252205 A1 | 11/2007 | Hoentschel et al. |
| 2002/0036322 | A1 | 3/2002 | Divakauni et al. | 2007/0263466 A1 | 11/2007 | Morishita et al. |
| 2002/0051378 | A1 | 5/2002 | Ohsawa | 2007/0278578 A1 | 12/2007 | Yoshida |
| 2002/0064913 | A1 | 5/2002 | Adkisson et al. | 2008/0049486 A1 | 2/2008 | Gruening-von Schwerin |
| 2002/0070411 | A1 | 6/2002 | Vermandel et al. | 2008/0083949 A1 | 4/2008 | Zhu et al. |
| 2002/0072155 | A1 | 6/2002 | Liu et al. | 2008/0099808 A1 | 5/2008 | Burnett et al. |
| 2002/0076880 | A1 | 6/2002 | Yamada et al. | 2008/0130379 A1 | 6/2008 | Ohsawa |
| 2002/0086463 | A1 | 7/2002 | Houston et al. | 2008/0133849 A1* | 6/2008 | Deml et al. .................. 711/154 |
| 2002/0089038 | A1 | 7/2002 | Ning | 2008/0165577 A1 | 7/2008 | Fazan et al. |
| 2002/0098643 | A1 | 7/2002 | Kawanaka et al. | 2008/0253179 A1 | 10/2008 | Slesazeck |
| 2002/0110018 | A1 | 8/2002 | Ohsawa | 2008/0258206 A1 | 10/2008 | Hofmann |
| 2002/0114191 | A1 | 8/2002 | Iwata et al. | 2009/0086535 A1 | 4/2009 | Ferrant et al. |
| 2002/0130341 | A1 | 9/2002 | Horiguchi et al. | 2009/0121269 A1 | 5/2009 | Caillat et al. |
| 2002/0160581 | A1 | 10/2002 | Watanabe et al. | 2009/0127592 A1 | 5/2009 | El-Kareh et al. |
| 2002/0180069 | A1 | 12/2002 | Houston | 2009/0201723 A1 | 8/2009 | Okhonin et al. |
| 2003/0003608 | A1 | 1/2003 | Arikado et al. | 2010/0085813 A1 | 4/2010 | Shino |
| 2003/0015757 | A1 | 1/2003 | Ohsawa | 2010/0091586 A1 | 4/2010 | Carman |
| 2003/0035324 | A1 | 2/2003 | Fujita et al. | 2010/0110816 A1 | 5/2010 | Nautiyal et al. |
| 2003/0042516 | A1 | 3/2003 | Forbes et al. | | | |
| 2003/0047784 | A1 | 3/2003 | Matsumoto et al. | FOREIGN PATENT DOCUMENTS | | |
| 2003/0057487 | A1 | 3/2003 | Yamada et al. | EP | 0 030 856 | 6/1981 |
| 2003/0057490 | A1 | 3/2003 | Nagano et al. | EP | 0 350 057 | 1/1990 |
| 2003/0102497 | A1 | 6/2003 | Fried et al. | EP | 0 354 348 | 2/1990 |
| 2003/0112659 | A1 | 6/2003 | Ohsawa | EP | 0 202 515 | 3/1991 |
| 2003/0123279 | A1 | 7/2003 | Aipperspach et al. | EP | 0 207 619 | 8/1991 |
| 2003/0146474 | A1 | 8/2003 | Ker et al. | EP | 0 175 378 | 11/1991 |
| 2003/0146488 | A1 | 8/2003 | Nagano et al. | EP | 0 253 631 | 4/1992 |
| 2003/0151112 | A1 | 8/2003 | Yamada et al. | EP | 0 513 923 | 11/1992 |
| 2003/0231521 | A1 | 12/2003 | Ohsawa | EP | 0 300 157 | 5/1993 |
| 2004/0021137 | A1 | 2/2004 | Fazan et al. | EP | 0 564 204 | 10/1993 |
| 2004/0021179 | A1 | 2/2004 | Lee | EP | 0 579 566 | 1/1994 |
| 2004/0029335 | A1 | 2/2004 | Lee et al. | EP | 0 362 961 | 2/1994 |
| 2004/0075143 | A1 | 4/2004 | Bae et al. | EP | 0 599 506 | 6/1994 |
| 2004/0108532 | A1 | 6/2004 | Forbes et al. | EP | 0 359 551 | 12/1994 |
| 2004/0188714 | A1 | 9/2004 | Scheuerlein et al. | EP | 0 366 882 | 5/1995 |
| 2004/0217420 | A1 | 11/2004 | Yeo et al. | EP | 0 465 961 | 8/1995 |
| 2005/0001257 | A1 | 1/2005 | Schloesser et al. | EP | 0 694 977 | 1/1996 |
| 2005/0001269 | A1 | 1/2005 | Hayashi et al. | EP | 0 333 426 | 7/1996 |
| 2005/0017240 | A1 | 1/2005 | Fazan | EP | 0 727 820 | 8/1996 |
| 2005/0047240 | A1 | 3/2005 | Ikehashi et al. | EP | 0 739 097 | 10/1996 |
| 2005/0062088 | A1 | 3/2005 | Houston | EP | 0 245 515 | 4/1997 |
| 2005/0063224 | A1 | 3/2005 | Fazan et al. | EP | 0 788 165 | 8/1997 |
| 2005/0064659 | A1 | 3/2005 | Willer | EP | 0 801 427 | 10/1997 |
| 2005/0105342 | A1 | 5/2005 | Tang et al. | EP | 0 510 607 | 2/1998 |
| 2005/0111255 | A1 | 5/2005 | Tang et al. | EP | 0 537 677 | 8/1998 |
| 2005/0121710 | A1 | 6/2005 | Shino | EP | 0 858 109 | 8/1998 |
| 2005/0135169 | A1 | 6/2005 | Somasekhar et al. | EP | 0 860 878 | 8/1998 |
| 2005/0141262 | A1 | 6/2005 | Yamada et al. | EP | 0 869 511 | 10/1998 |
| 2005/0141290 | A1 | 6/2005 | Tang et al. | EP | 0 878 804 | 11/1998 |
| 2005/0145886 | A1 | 7/2005 | Keshavarzi et al. | EP | 0 920 059 | 6/1999 |
| 2005/0145935 | A1 | 7/2005 | Keshavarzi et al. | EP | 0 924 766 | 6/1999 |
| 2005/0167751 | A1 | 8/2005 | Nakajima et al. | EP | 0 642 173 | 7/1999 |
| 2005/0189576 | A1 | 9/2005 | Ohsawa | EP | 0 727 822 | 8/1999 |
| 2005/0208716 | A1 | 9/2005 | Takaura et al. | EP | 0 933 820 | 8/1999 |
| 2005/0226070 | A1 | 10/2005 | Ohsawa | EP | 0 951 072 | 10/1999 |
| 2005/0232043 | A1 | 10/2005 | Ohsawa | EP | 0 971 360 | 1/2000 |
| 2005/0242396 | A1 | 11/2005 | Park et al. | EP | 0 980 101 | 2/2000 |
| 2005/0265107 | A1 | 12/2005 | Tanaka | EP | 0 601 590 | 4/2000 |
| 2006/0043484 | A1 | 3/2006 | Cabral et al. | EP | 0 993 037 | 4/2000 |
| 2006/0084247 | A1 | 4/2006 | Liu | EP | 0 836 194 | 5/2000 |
| 2006/0091462 | A1 | 5/2006 | Okhonin et al. | EP | 0 599 388 | 8/2000 |

| | | |
|---|---|---|
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor Ram (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-Box for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006, IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless It DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible For Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying Of Hot Carrier Effect in Floating Body Soi Mosfets By The Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562 μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body Dram Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body Ram (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm Box Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-Dram Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-Dram Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

US 7,957,206 B2

READ CIRCUITRY FOR AN INTEGRATED CIRCUIT HAVING MEMORY CELLS AND/OR A MEMORY CELL ARRAY, AND METHOD OF OPERATING SAME

In one aspect, the present inventions described and illustrated herein relate to an integrated circuit device having a memory cell array and read circuitry to detect, sense, sample and/or determine a data state of the memory cells in the array. More particularly, in one aspect, the present inventions relate to an integrated circuit having memory cell array including a plurality of memory cells (for example, memory cells having an electrically floating body in which a charge is stored) wherein read circuitry is selectively coupled to one or more memory cells to detect, sense, sample and/or determine a data state of the one or more memory cells.

Briefly, with reference to FIG. 1, memory cell array 10 typically includes a plurality of memory cells 12 arranged in a matrix of rows and columns. A row address decoder enables one or more rows to be read by sensing circuitry (for example, a plurality of sense amplifiers). A column decoder, in response to an address, selects one or more of the outputs of the data sensing circuitry.

One type of dynamic random access memory cell is based on, among other things, a floating body effect of, for example, semiconductor on insulator (SOI) transistors. (See, for example, U.S. Pat. No. 6,969,662, U.S. Patent Application Publication No. 2006/0131650 and U.S. Patent Application Publication No. 2007/0058427). In this regard, the memory cell may consist of a partially depleted (PD) or a fully depleted (FD) SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of cell is determined by the concentration of charge in the body of the transistor.

With reference to FIGS. 2A, 2B, 2C and 2D, in one exemplary embodiment, memory cell array 10 may include a plurality of memory cells 12, each consisting of (or consisting essentially of) transistor 14 having gate 16, an electrically floating body region 18, source region 20 and drain region 22. The electrically floating body region 18 is disposed between source region 20 and drain region 22. Moreover, body region 18 is disposed on or above region 24, which may be an insulation region (for example, a silicon dioxide or silicon nitride material of an SOI material) or non-conductive region (for example, in bulk-type material). The insulation or non-conductive region may be disposed on substrate 26.

Data is written into or read from a selected memory cell by applying suitable control signals to a selected word line(s) 28, and/or a selected bit line(s) 32. In this illustrative embodiment, source line (30) is a common node in a typical implementation though it could be similarly decoded. In response, charge carriers are accumulated in or emitted and/or ejected from electrically floating body region 18 wherein the data states are defined by the amount of carriers within electrically floating body region 18. Notably, the entire contents of U.S. Pat. Nos. 6,969,662, 7,301,803 and U.S. Patent Application Publication No. 2007/0058427, including, for example, all features, attributes, architectures, configurations, materials, techniques and advantages described and illustrated therein, are incorporated by reference herein.

As mentioned above, memory cell 12 of memory cell array 10 operates by accumulating in or emitting/ejecting majority carriers (electrons or holes) 34 from body region 18 of, for example, N-channel transistors. (See, FIGS. 3A and 3B). In this regard, accumulating majority carriers (in this illustrative example, "holes") 34 in body region 18 of memory cells 12 via, for example, impact ionization near source region 20 and/or drain region 22, is representative of a logic high or "1" data state. (See, FIG. 3A). Emitting or ejecting majority carriers 34 from body region 18 via, for example, forward biasing the source/body junction and/or the drain/body junction, is representative of a logic low or "0" data state. (See, FIG. 3B).

Several arrangements, layouts and techniques have been proposed to read the data stored in an electrically floating body type transistor. (See, for example, U.S. Pat. No. 6,567,330; "Memory Design Using a One-Transistor Cell on SOI", IEEE Journal of Solid-State Circuits, Vol. 37, No. 11, November 2002; and U.S. Pat. No. 7,301,838). For example, a current sense amplifier (cross-coupled type) may be employed to compare the cell current to a reference current, for example, the current of a reference cell. From that comparison, it is determined whether the memory cell contained a logic high data state (relatively more majority carriers contained within body region) or logic low data state (relatively less majority carriers contained within body region). The differences of the charge stored in the body of the transistor affect the threshold voltage of the transistor, which in turn affects the current conducted by the transistor when switched into its conductive state.

In particular, the sense amplifier (for example, a cross-coupled sense amplifier) typically includes an input/output connected to an associated bit line and an input connected to a reference current generator. In operation, the sense amplifier compares the current conducted by the memory cell with a reference current. The magnitude of the reference current generally lies between the magnitudes of the currents conducted in the logic high data state and logic low data state of the memory cell. The sense amplifier compares the reference current to the current produced by the memory cell (the current varies depending on whether the memory cell is either in a logic high data state or logic low data state). Based on that comparison, the sense amplifier generates or outputs an output signal having a predetermined polarity (for example, a positive or negative polarity) depending on the data state stored in the memory cell (for example, whether the memory cell stored a logic high or a logic low binary data state). (See, for example, U.S. Pat. No. 6,567,330; "Memory Design Using a One-Transistor Cell on SOI", IEEE Journal of Solid-State Circuits, Vol. 37, No. 11, November 2002; and U.S. Pat. No. 7,301,838).

SUMMARY OF CERTAIN ASPECTS OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to an integrated circuit device comprising a memory cell array including a plurality of memory cells and a bit line having an intrinsic capacitance, wherein a plurality of the memory cells are coupled to the bit line. In this embodiment, each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor. The integrated circuit device further includes memory cell control circuitry, coupled to the memory cell array, to generate one or more read control signals to perform a read operation wherein, in response to the one or more read control signals, the electrically floating body transistor associated with a selected memory cell conducts a current, which is representative of the data state stored in the selected memory cell, on the bit line. The integrated circuit device also includes sense amplifier circuitry having an input which is electrically coupled to the bit line to receive a signal which is responsive to the current conducted on the bit line by the electrically floating body transistor of the selected memory cell and, in response thereto, to (i) sense the data state stored in the selected memory cell and (ii) output a signal which is representative thereof. Current regulation circuitry, electrically coupled to the bit line, sinks or sources at least a portion of the current conducted on the bit line by the electrically floating body transistor of the selected memory cell during only a portion of the read operation. In addition, sensing circuitry, coupled between the bit line and the current regulation circuitry, responsively couples the current regulation circuitry to the bit line during the portion of the read operation.

In one embodiment, the sensing circuitry includes a transistor (for example, a p-channel or n-channel type transistor) wherein the transistor provides a current path between the bit line and the current regulation circuitry in response to a predetermined voltage on the bit line. In another embodiment, the sensing circuitry includes a switch which provides a current path between the bit line and the current regulation circuitry in response to a predetermined voltage on the bit line.

The sense amplifier circuitry (for example, a cross-coupled sense amplifier) may sense the data state of the selected memory cell using an amplitude of the voltage on the bit line. The amplitude of the voltage on the bit line is responsive to the amount of current on the bit line conducted by the electrically floating body transistor associated with the selected memory cell during the read operation.

In one embodiment, the current regulation circuitry includes a current mirror circuit.

Notably, the electrically floating body transistor associated with the selected memory cell may conduct a channel current which is representative of the data state of the memory cell on the bit line. The electrically floating body transistor associated with the selected memory cell may conduct a bipolar transistor current which is representative of the data state of the memory cell on the bit line.

In another aspect, the present inventions may be directed to an integrated circuit device comprising a memory cell array including a plurality of memory cells arranged in a matrix of rows and columns, wherein each memory cell is programmable to store one of a plurality of data states, and a bit line having an intrinsic capacitance, wherein a plurality of the memory cells are coupled to the bit line. The integrated circuit device may include memory cell control circuitry, coupled to the memory cell array, to generate one or more read control signals to perform a read operation wherein, in response to the one or more read control signals, a selected memory cell conducts a current, which is representative of the data state stored in the selected memory cell, on the bit line. Sense amplifier circuitry having an input which is electrically coupled to the bit line may receive a signal which is responsive to the current conducted on the bit line, and, in response thereto, to (i) sense the data state stored in the selected memory cell and (ii) output a signal which is representative thereof. The integrated circuit device may also include current regulation circuitry, electrically coupled to the bit line, to sink or source at least a portion of the current conducted on the bit line by the selected memory cell during only a portion of the read operation. Sensing circuitry, coupled between the bit line and the current regulation circuitry, may responsively couple the current regulation circuitry to the bit line during the portion of the read operation.

In one embodiment, the sensing circuitry includes a transistor (for example, a p-channel or n-channel type transistor) wherein the transistor provides a current path between the bit line and the current regulation circuitry in response to a predetermined voltage on the bit line. In another embodiment, the sensing circuitry includes a switch which provides a current path between the bit line and the current regulation circuitry in response to a predetermined voltage on the bit line.

The sense amplifier circuitry (for example, a cross-coupled sense amplifier) may sense the data state of the selected memory cell using an amplitude of the voltage on the bit line. The amplitude of the voltage on the bit line is responsive to the amount of current on the bit line conducted by the electrically floating body transistor associated with the selected memory cell during the read operation.

In one embodiment, the current regulation circuitry includes a current mirror circuit.

In another aspect, the present inventions are directed to an integrated circuit device comprising a memory cell array including: (a) a plurality of memory cells wherein each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor, and (b) a bit line having an intrinsic capacitance, wherein a plurality of the memory cells are coupled to the bit line. The integrated circuit according to this aspect of the present inventions includes:

means for generating one or more read control signals to perform a read operation wherein, in response to the one or more read control signals, the electrically floating body transistor associated with a selected memory cell provides a current, which is representative of the data state stored in the selected memory cell, on the bit line;

means for receiving a signal which is responsive to the current conducted on the bit line by the electrically floating body transistor of the selected memory cell and, in response thereto, for (i) sensing the data state stored in the selected memory cell and (ii) outputting a signal which is representative thereof;

means for sinking or sourcing at least a portion of the current provided on the bit line by the electrically floating body transistor of the selected memory cell during only a portion of the read operation; and means for responsively and electrically coupling the current regulation circuitry to the bit line during the portion of the read operation.

In another aspect, the present inventions are directed to a method of reading a memory cell which is disposed on integrated circuit device comprising a memory cell array including a plurality of memory cells arranged in a matrix of rows and columns, wherein the memory cell array includes a plurality of memory cells wherein each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor. The method according to this aspect of the inventions comprises generating read control signals to perform a read operation wherein, in response to read control signals, the electrically floating body transistor associated of a selected memory cell conducts a current which is representative of the data state of the memory cell on a bit line;

determining the data state stored in the selected memory cell using a signal which is responsive to the current conducted by the electrically floating body transistor and, in response thereto, outputting a data state signal which is representative of the data state of the memory cell on the bit line; and sinking or sourcing at least a portion of the current conducted on the bit line by the electrically floating body transistor of the selected memory cell during only a portion of the read operation.

In one embodiment, the method may further include sensing a predetermined voltage on the bit line, wherein sinking or sourcing at least a portion of the current conducted on the bit line further includes sinking or sourcing a substantial portion of the current provided on the bit line by the electrically floating body transistor after sensing the predetermined voltage on the bit line. In another embodiment, the method may further include providing a current path during only a portion of the read operation in order to sink or source at least a portion of the current provided on the bit line by the electrically floating body transistor of the selected memory cell.

Notably, determining the data state stored in the selected memory cell using the signal which is responsive to the current conducted by the electrically floating body transistor may further includes using an amplitude of the voltage on the bit line to determine the data state stored in the selected memory cell. The amplitude of the voltage on the bit line may be responsive to the amount of current conducted on the bit line during the read operation.

Again, there are many inventions, and aspects of the inventions, described and illustrated herein. This Summary of the Inventions is not exhaustive of the scope of the present inventions. Indeed, this Summary of the Inventions may not be reflective of or correlate to the inventions protected by the claims in this or in continuation/divisional applications hereof.

Moreover, this Summary of the Inventions is not intended to be limiting of the inventions or the claims (whether the currently presented claims or claims of a divisional/continuation application) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings illustrate different aspects of the present inventions and, where appropriate, reference numerals illustrating like structures, components, materials and/or elements in different figures are labeled similarly. It is understood that various combinations of the structures, components, materials and/or elements, other than those specifically illustrated, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 4A-4D are schematic block diagram illustrations of exemplary read circuitry, according to certain aspects and/or embodiments of the present inventions, wherein FIGS. 4A and 4C illustrate exemplary embodiments of read circuitry in conjunction with generic memory cells and the memory cell array including a plurality of such memory cells, and FIGS. 4B and 4D illustrate exemplary embodiments of read circuitry in conjunction with a specific memory cell which includes an electrically floating body transistor (wherein the data state is stored in the electrically floating body region) and the memory cell array including a plurality of such memory cells;

FIGS. 11A-11C are schematic block diagram illustrations of exemplary integrated circuit devices in which the sense amplifier circuitry and/or architecture may be implemented, wherein FIGS. 11A and 11C are logic devices (having logic circuitry and resident memory) and FIG. 11B is a memory device (having primarily function of memory), according to certain aspects of the present inventions;

Figure 1:
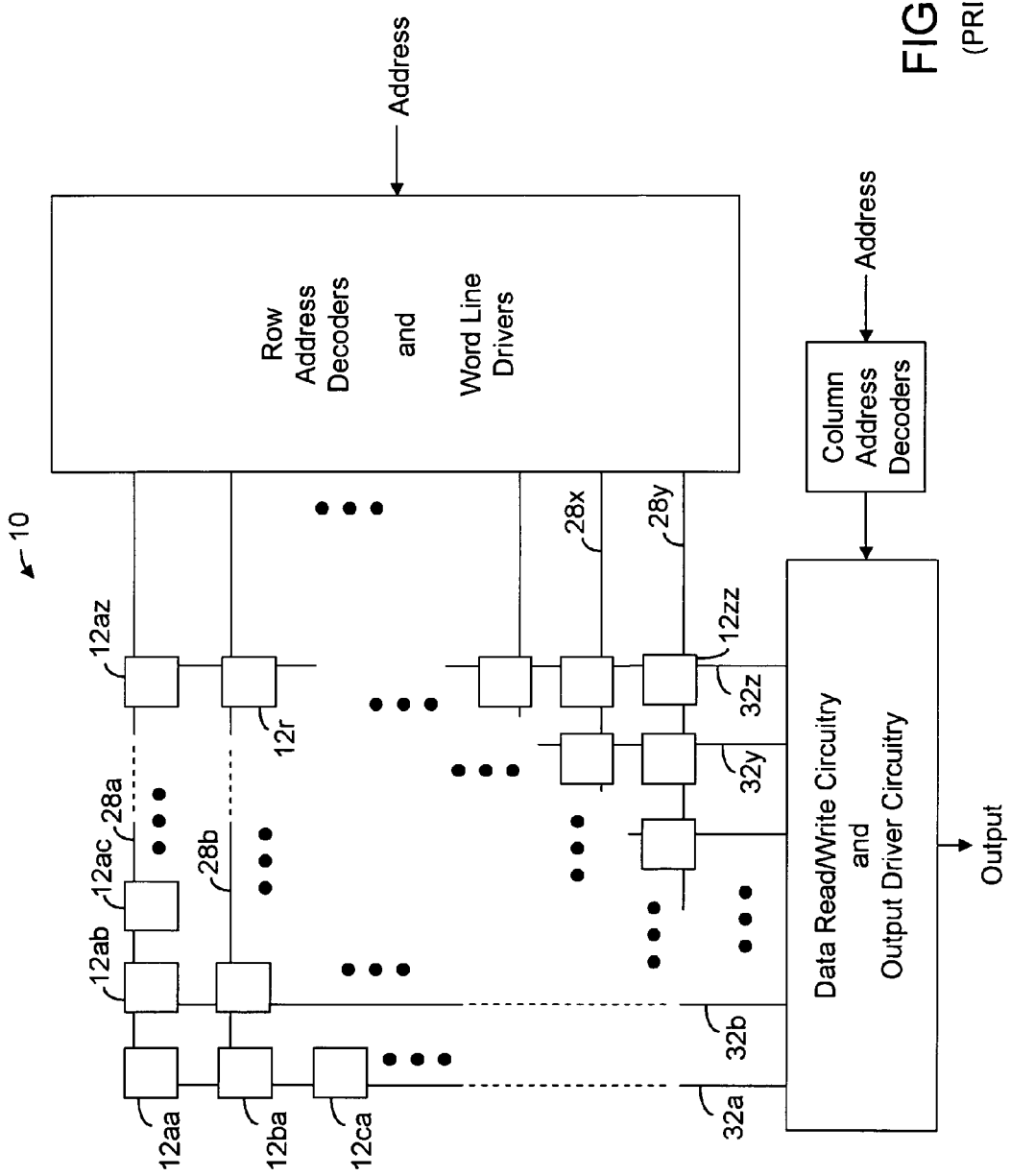
FIG. 1 is a schematic block diagram illustration of a conventional memory cell array having a plurality of memory cells arranged in an array of a plurality of rows and columns, in conjunction with row and column address decoders, word line drivers and data read/write circuitry.
Figure 2A:
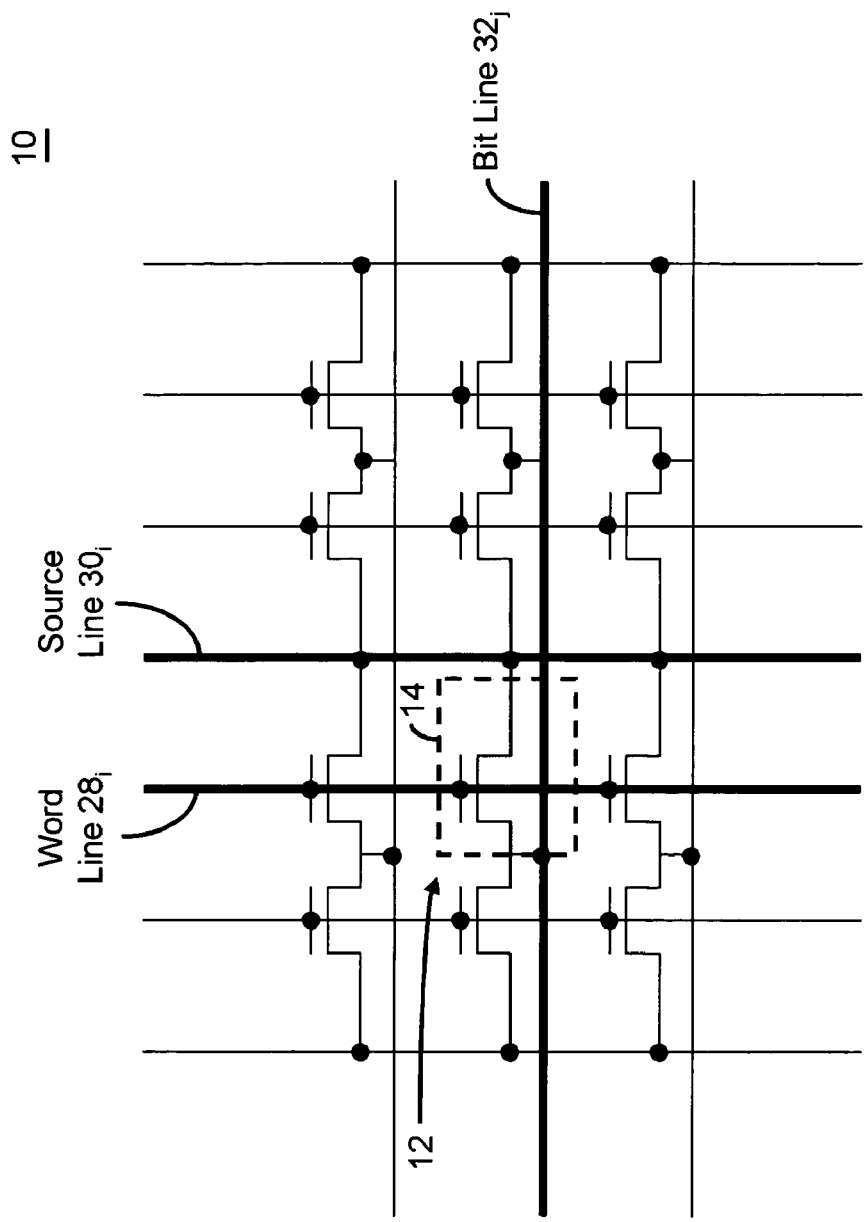
FIG. 2A is a schematic representation of a portion of a prior art memory cell array including a plurality of memory cells wherein each memory cell includes one electrically floating body transistor.
Figure 2B:
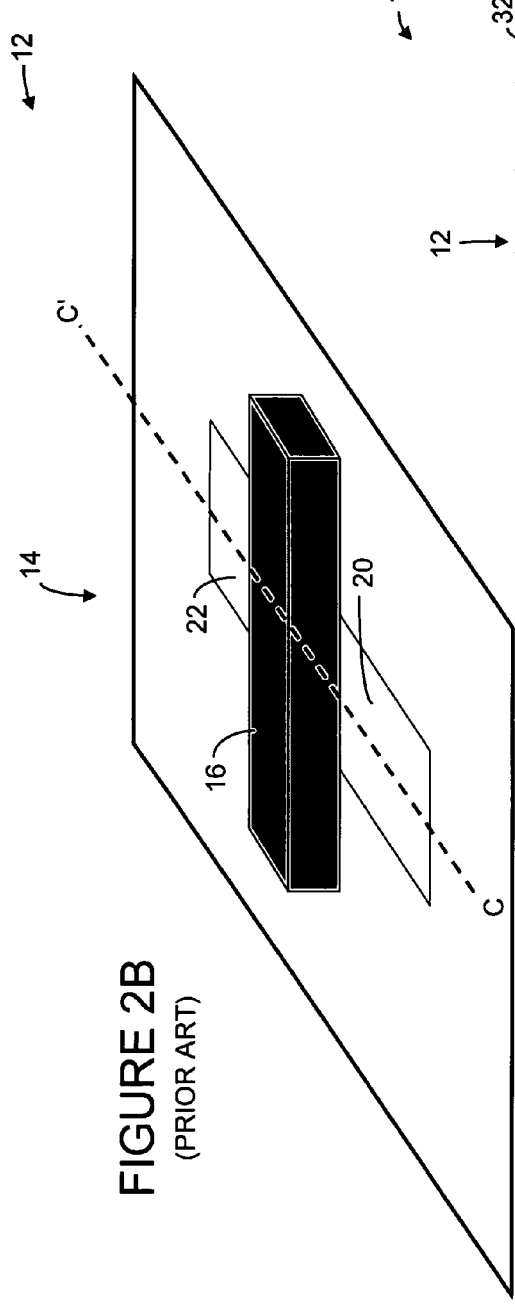
FIG. 2B is a three dimensional view of an exemplary prior art memory cell comprised of one electrically floating body transistor (PD-SOI NMOS)
Figure 2D:
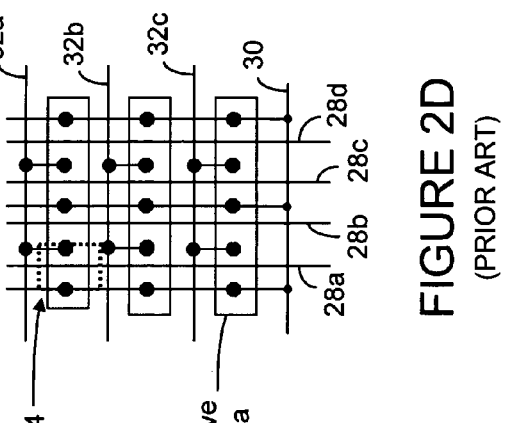
FIG. 2D is a plan view layout (not drawn to scale) of a portion of the memory cell array of FIG. 2A.
Figure 2C:
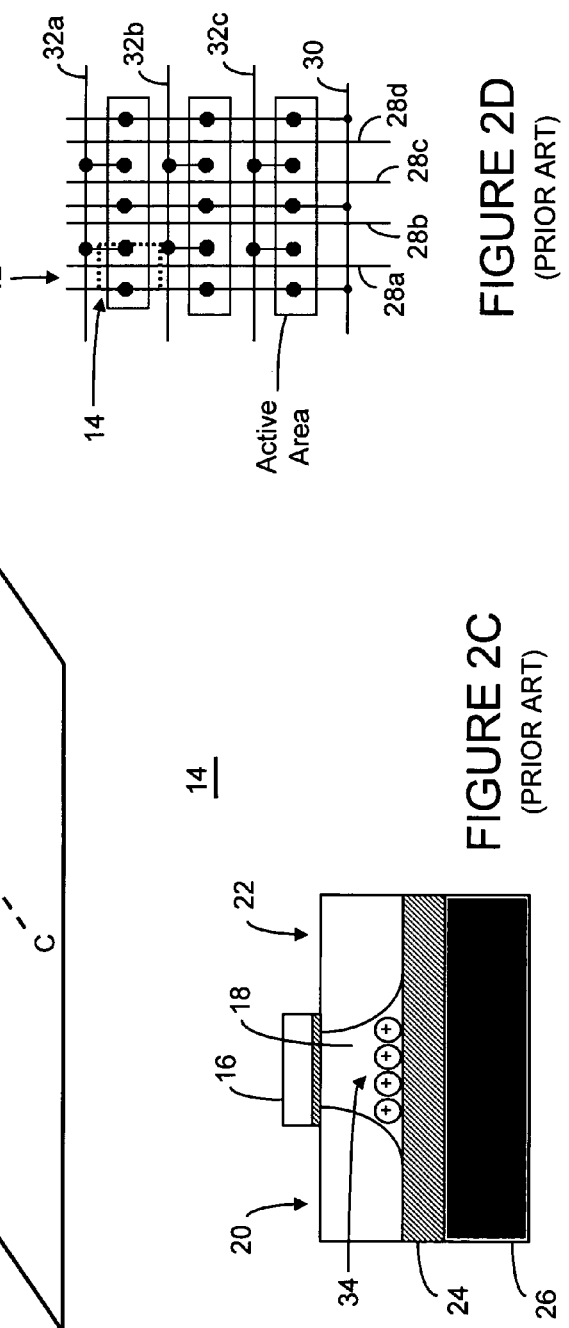
FIG. 2C is a cross-sectional view of the memory cell of FIG. 2B, cross-sectioned along line C-C'.
Figure 3A:
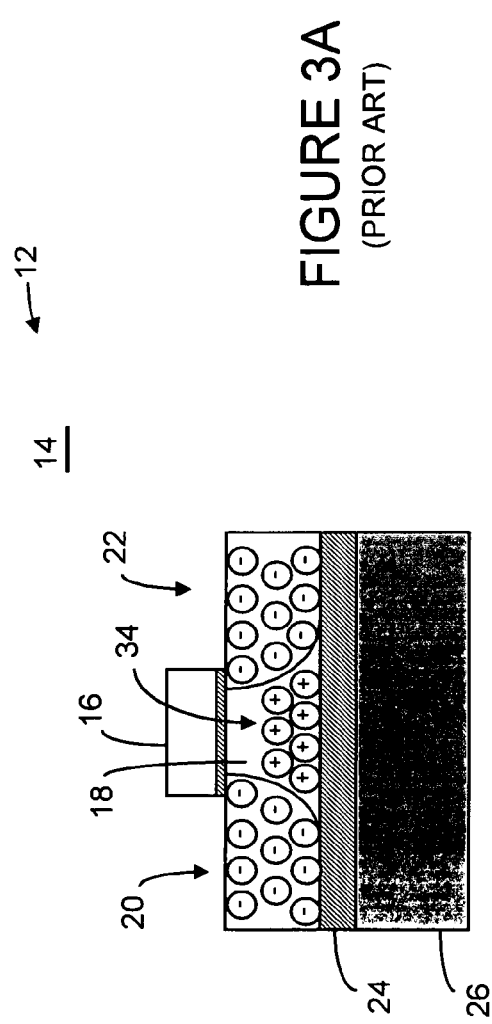
FIGS. 3A and 3B are exemplary schematic illustrations of the charge relationship, for a given data state, of a prior art memory cell comprised of an electrically floating body transistor (N-channel type transistor)
Figure 3B:
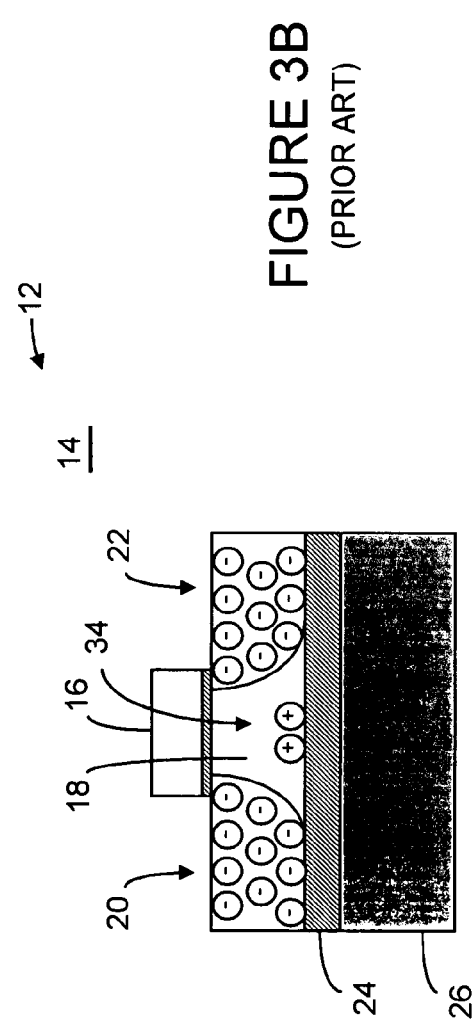

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to an integrated circuit device having read circuitry and/or read circuitry architectures for use with a memory cell array having a plurality of memory cells arranged, for example, in a matrix of rows and columns. In another aspect, the present inventions are directed to methods of reading and/or operating the memory cells of the memory cell array using, for example, the read circuitry of the present inventions. The memory cell array and read circuitry and/or architectures may comprise a portion of the integrated circuit device, for example, a logic device (such as, a microcontroller, microprocessor or the like) or a memory device (such as, a discrete memory device).

Notably, the present inventions may be implemented in conjunction with any memory cell technology, whether now known or later developed. For example, the memory cells may include one or more transistors having electrically floating body regions, one or more transistors wherein each transistor includes a plurality of electrically floating gates, junction field effect transistors (often referred to as JFETs), thyristor-based memory cells or any other memory/transistor technology whether now known or later developed. All such memory technologies are intended to fall within the scope of the present inventions.

Moreover, the present inventions may be implemented in conjunction with any type of memory type (whether discrete or integrated with logic devices). For example, the memory may be a DRAM, SRAM and/or Flash. All such memories are intended to fall within the scope of the present inventions.

Indeed, in one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) U.S. Pat. No. 7,301,838, (3) U.S. Pat. No. 7,301,838, (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in their entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor which may determine the amount of current output or conducted in response to the application of read control signals.

Figure 4A:
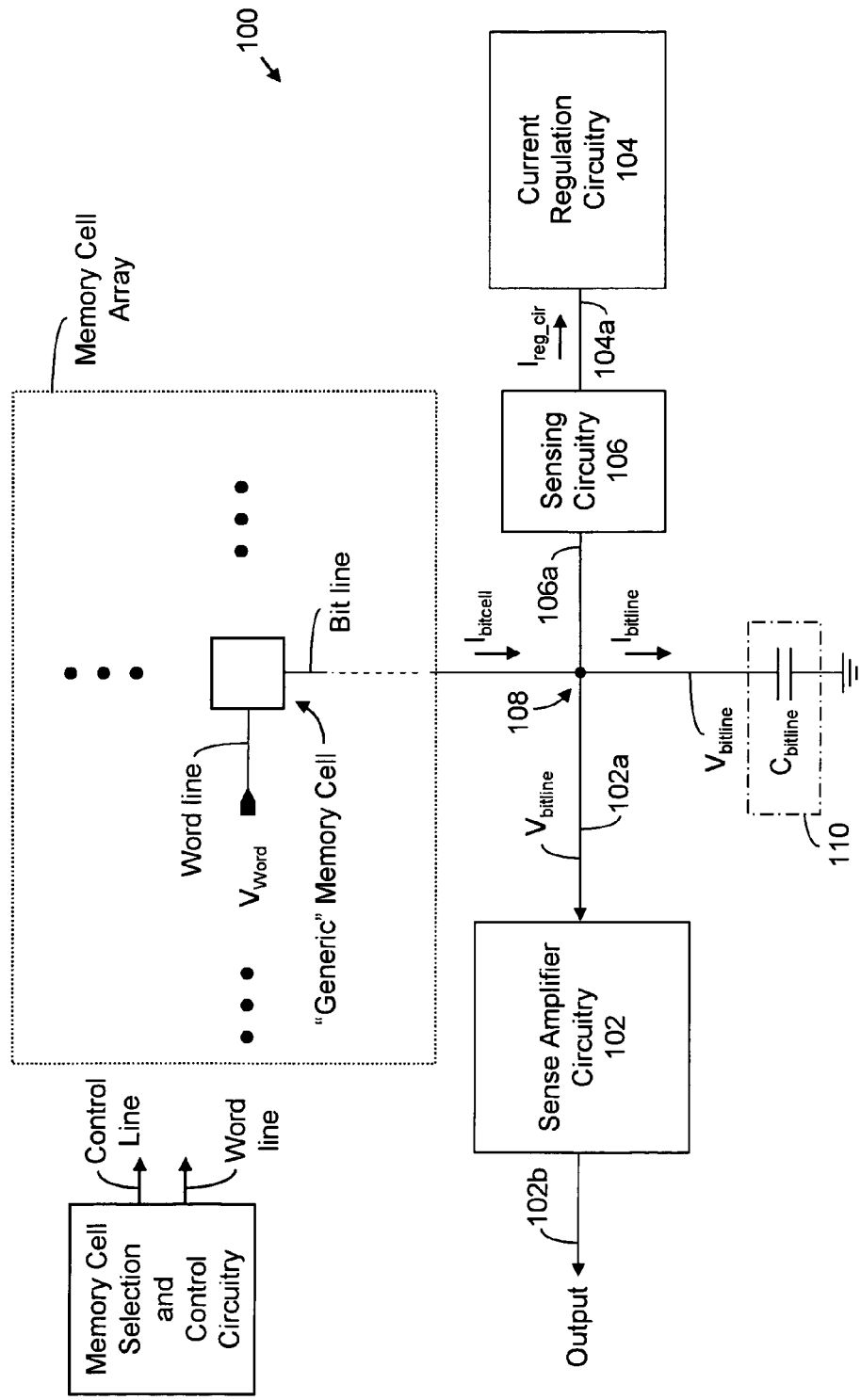
Figure 4B:
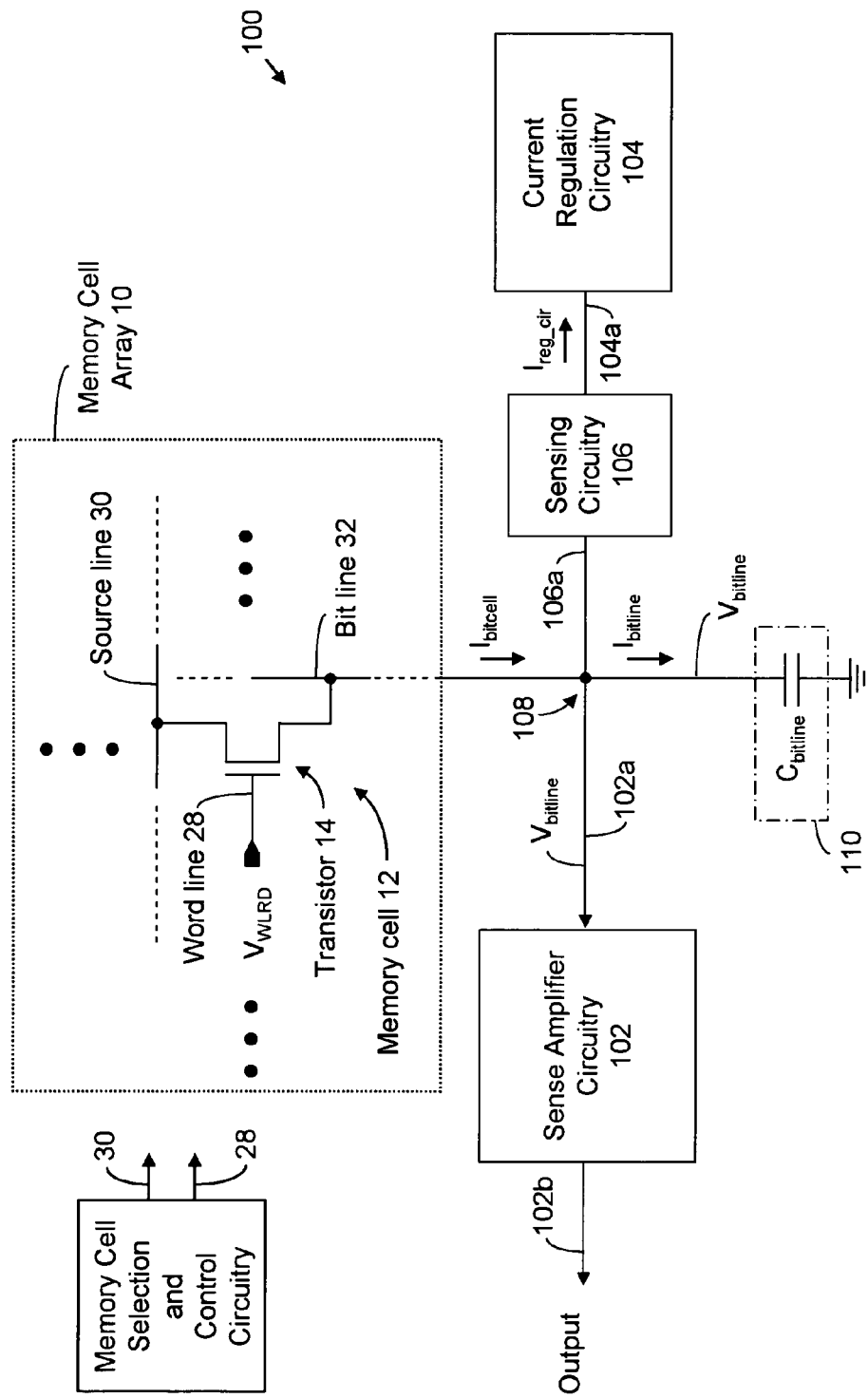

With reference to FIGS. 4A and 4B, read circuitry 100 according to exemplary embodiments of the present inventions may include sense amplifier circuitry 102, current regulation circuitry 104 and sensing circuitry 106. In one illustrated embodiment, the present inventions are implemented in conjunction with a "generic" memory cell technology. (See, for example, FIG. 4A wherein read circuitry 100 is illustrated in conjunction with any type of memory cell and a memory cell array including a plurality of such memory cells). In another illustrated embodiment, the present inventions are implemented in conjunction with a memory cell array 10 having a plurality of memory cells 12 including at least one electrically floating body transistor 14. (See, for example, FIG. 4B).

With continued reference to FIGS. 4A and 4B, sense amplifier circuitry 102, reads, senses, samples, detects and/or determines the data state stored in the memory cell. In one embodiment, sense amplifier circuitry 102 (for example, a cross-coupled sense amplifier or a comparator) is coupled to the bit line, at given or predetermined time in the read operation, to receive a signal which is representative of the data state stored in the memory cell (for example, $V_{bitline}$).

Figure 5A:
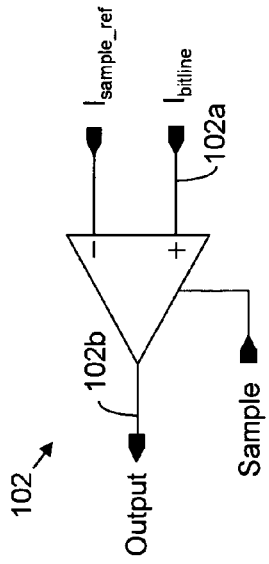
FIGS. 5A and 5B are schematic block diagram illustrations of exemplary sense amplifier circuitry of FIGS. 4A-4D, according to certain aspects and/or embodiments of the present inventions.
Figure 5B:
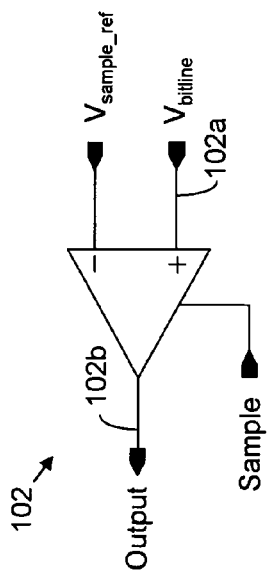

The sense amplifier circuitry 102 may employ sensing circuitry and/or techniques. In the context of a voltage sense amplifier, sense amplifier circuitry 102 may, in response to a control signal, compare a signal which is representative of the data state of the memory cell to a reference signal, for example, a voltage of a reference cell or output of reference generation circuitry. (See, for example, FIGS. 5A and 5B). From that comparison, sense amplifier circuitry 102 determines the data state stored in the memory cell.

The sense amplifier circuitry 102 may be any circuitry and employ any technique, whether now known or later developed, which reads, senses, samples, detects and/or determines the data state stored in the memory cell. For example, sense amplifier circuitry 102 may include the circuitry described and illustrated in U.S. Pat. No. 7,301,838. Alternatively, the sense amplifier include the sense amplifier circuitry described and illustrated in U.S. Provisional Patent Application Ser. No. 60/967,605 (Inventor: Philippe Graber, Filed: Sep. 6, 2007, Title: "Sense Amplifier Circuitry for Integrated Circuit Having Memory Cell Array, and Method of Operating Same").

Notably, in the illustrative embodiment of FIG. 4B, sense amplifier circuitry 102 may couple to one of the regions of transistor 14 (for example, drain region 22) of memory cell 12 to read, sense, sample, detect and/or determine the data state stored in memory cell 12 based on or based substantially on the current output or conducted by transistor 14 (i.e., $I_{bitcell}$) of memory cell 12. In one embodiment, sense amplifier circuitry 102 reads, senses, samples, detects and/or determines the data state stored in memory cell 12 based on or based substantially on a bipolar transistor current (or a signal which is representative thereof) output and/or conducted by transistor 14 (via the intrinsic bipolar transistor), as described in, for example, U.S. Pat. No. 7,301,803 and U.S. Patent Application Publication Nos. 2007/0058427 and 2007/0187775. In another embodiment, sense amplifier circuitry 102 reads, senses, samples, detects and/or determines the data state stored in memory cell 12 based on or based substantially on a channel current (or a signal which is representative thereof) output and/or conducted by transistor 14, as described in, for example, U.S. Pat. No. 6,969,662. Under either of these circumstances, the current output and/or conducted by transistor 14 (whether bipolar, channel or a combination thereof) is based on (or substantially based on) the relative amount of majority carriers stored, contained or resident in electrically floating body region 18 of transistor 14 of memory cell 12 (relatively more majority carries 34 contained within body region 18 may be representative of a logic high data state and a relatively less majority carries 28 contained within body region 18 may be representative of a logic low data state).

With continued reference to FIGS. 4A and 4B, read circuitry 100 further includes current regulation circuitry 104 to regulate and/or control the amount of current which flows through the memory cell during the read operation (in those instances where the selected memory cell stores a logic high data state). In this regard, during implementation of the read operation, the current (i.e., $I_{bitcell}$) output or conducted by the memory cell (for example, by transistor 14 of memory cell 12 illustrated in FIG. 4B), or a portion thereof, is provided to node 108. Under certain conditions and circumstances which are discussed in detail below, where the selected memory cell stores a logic high data state, a portion or all of the current (i.e., $I_{bitcell}$) charges the intrinsic capacitance of the bit line, which is represented by capacitor 110 ($C_{bitline}$). In addition, once the amplitude of the voltage on the bit line ($V_{bitline}$) is at or exceeds a predetermined value, a portion of the current output or conducted by the memory cell (i.e., $I_{bitcell}$) is provided to current regulation circuitry 104 (i.e., $I_{reg\_cir}$). The charge integrated and/or stored by the intrinsic capacitance of the bit line (i.e., capacitor 110) provides a voltage $V_{bitline}$ which, in one example, is employed by sense amplifier circuitry 102 to read, sense, sample, detect and/or determine the data state stored in memory cell coupled to the bit line (for example, memory cell 12 coupled to bit line 32 in FIG. 4B). Thus, in the illustrated embodiment of FIGS. 4B, a voltage signal is employed to determine the state of the memory cell and that voltage is generated by storing or integrating (on or by bitline capacitor 110) the current output or conducted by memory cell 12 during a certain time interval.

Notably, regulating the current output or conducted by transistor 14 of memory cell 12 may provide an advantage during operation of memory cells 12 in memory cell array 10. (See, for example, FIG. 4B). In this embodiment, voltage across the memory cell 12 self adjusts to sustain current imposed by current regulation circuitry 104. In this regard, the voltage levels applied to the gate of transistor 14 for reading and writing may be the same or substantially the same. In this way, transistor 14 of memory cell 12 may be configured in the same or similar condition at the conclusion of a read operation (where memory cell 12 stores a logic high data state) and write operation (where a logic high data state is written into or stored in memory cell 12). Such a situation may be advantageous where the memory cell array is configured in particular architectures where the level of charge stored in memory cells programmed to a logic high state has to be well controlled such that little to no disturbance may be observed in memory cells adjacent to a selected memory cell (which stores a logic high data state). Thus, by regulating the current, in the manner described herein, the operation and response of memory cells 12 may be more reliable and the peripheral control circuitry and control techniques (for example, the word line drivers and data read/write circuitry—see, for example, FIG. 1) may be simplified.

Figure 6A:
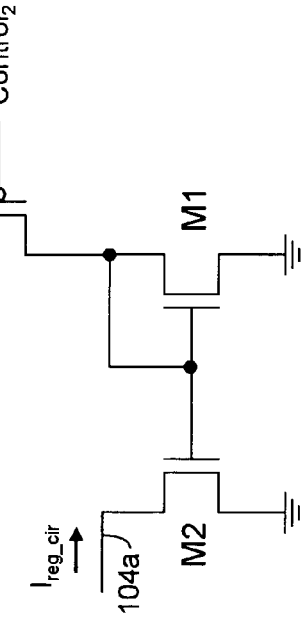
FIGS. 6A and 6B are schematic block diagram illustrations of exemplary current regulation circuitry of FIGS. 4A-4D, according to certain aspects and/or embodiments of the present inventions.

The current regulation circuitry 104 may be any circuitry, whether now known or later developed, which controls the amount of an input or output current. For example, current regulation circuitry 104 may be implemented using a current mirror circuit. (See, for example, FIG. 6A). In the illustrative embodiment of FIG. 6A, current regulation circuitry 104 will seek to sink an input current ($I_{reg\_cir}$) which is equal to an amount of current $I_{reg\_max}$. Notably, current regulation circuitry 104 may be implemented via other circuitry and/or techniques; all such circuitry and/or techniques, whether now known or later developed, are intended to fall within the scope of the present inventions.

Figure 6B:
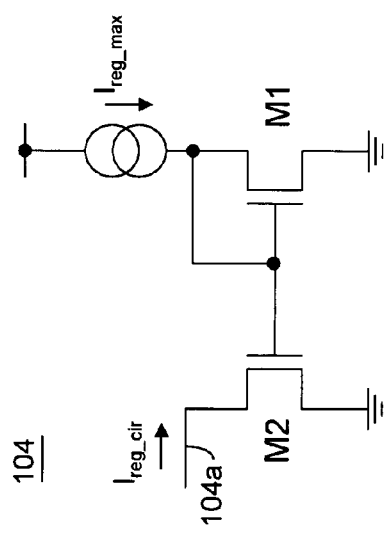

With reference to FIG. 6B, in one embodiment, the current source may include two transistors (in one exemplary embodiment, two P-channel type transistors). The two transistors, in combination, generate (or attempt to generate) a relatively stable constant current. Although the current ($I_{reg\_max}$) provided by the current source depends on the distribution, range and/or anticipated of the output current of the memory cell (among other things), in one exemplary embodiment, the current $I_{reg\_max}$ may be 5 µA under those circumstances where output current of transistor 14 of memory cell 12 is expected to be 30 µA when a logic high data state is stored therein and read therefrom. Notably, current source may be any circuit or device, whether now known or later developed, which generate and output a relatively stable constant current.

With reference to FIGS. 4A and 4B, read circuitry 100 further includes sensing circuitry 106, disposed between node 108 and the input of current regulation circuitry 104. In operation, sensing circuitry 106 responsively couples node 108 (or provides a current path from node 108) to current regulation circuitry 104. In this regard, in response to sensing, detecting and/or determining (i) a predetermined amount of current provided to charge the intrinsic capacitance (capacitor 110 ($C_{bitline}$)) of the bit line and/or (ii) a predetermined voltage at node 108, sensing circuitry 106 couples node 108 (or provides a current path from node 108) to current regulation circuitry 104 so that, thereafter, a portion (or all) of the current output or conducted by the memory cell (i.e., $I_{bitline}$) is provided to or sunk by current regulation circuitry 104. Thus, sensing circuitry 106, in conjunction with current regulation circuitry 104, controls and/or regulates the amount of current available from or provided by the memory cell (i.e., $I_{bitline}$) to charge the intrinsic capacitance (capacitor 110 ($C_{bitline}$)) of the bit line and/or form, provide or establish a voltage at node 108. In this way, at a given point in time in the read operation, sense amplifier circuitry 102 may read, sense, sample, detect and/or determine a logic high data state stored in the memory cell—regardless of the different output or response characteristics and/or distributions of the memory cells of the memory cell array. That is, the amplitude of the input signal of sense amplifier circuitry 102 (which is used to read, sense, sample, detect and/or determine a logic high data state stored in the memory cell) may be limited or restricted (the distribution thereof relatively more narrow) notwithstanding the distribution of different output or response characteristics of the memory cells of the memory cell array.

The sensing circuitry 106 may be any circuitry and employ any technique, whether now known or later developed, which (1) senses, detects and/or determines a predetermined amount of current to the intrinsic capacitance (capacitor 110 ($C_{bitline}$)) of the bit line and/or a predetermined voltage at node 108, and (2) electrically couples node 108 (or provides a current path from node 108) to current regulation circuitry 104. For example, sensing circuitry 106 may be implemented using comparator circuitry 112 to sense, detect and/or determine the amount of charge or current by memory cell (i.e., $I_{bitline}$) and/or (ii) amplitude of the voltage at node 108. (See, for example, FIGS. 7A and 7B). In the illustrative embodiment of FIGS. 7A and 7B, when the voltage on signal line 106a is equal to or exceeds a predetermined or threshold voltage ($V_{threshold}$), comparator enables the switch 114a or transistor 114b to connect current regulation circuitry 104 to node 108 and thereafter allow current ($I_{reg\_cir}$) to flow to current regulation circuitry 104 which sinks some or all of the current output from or conducted by the memory cell ($I_{bitline}$).

In one embodiment, the amplitude or level of the threshold voltage ($V_{threshold}$) is less than the bit line voltage quiescent point. For example, the threshold voltage ($V_{threshold}$) may be 0.1V.

Figure 7C:
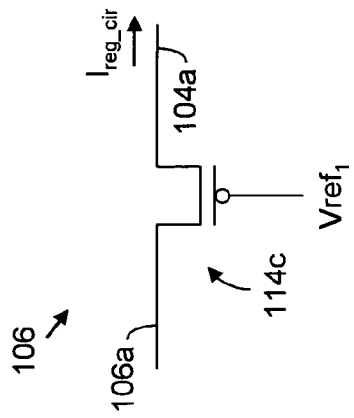
FIGS. 7A-7D are schematic block diagram illustrations of exemplary sensing circuitry of FIGS. 4A-4D, according to certain aspects and/or embodiments of the present inventions.
Figure 7D:
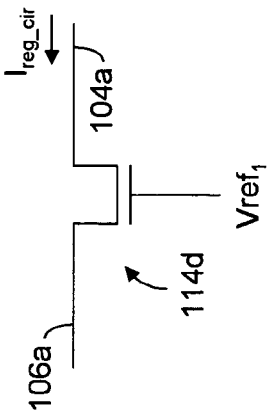
Figure 7A:
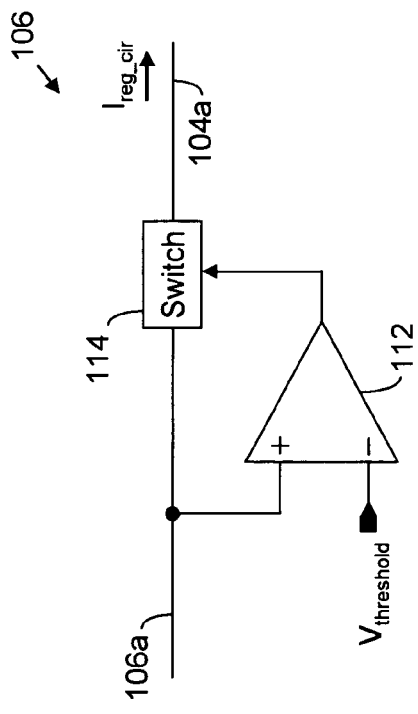
Figure 7B:
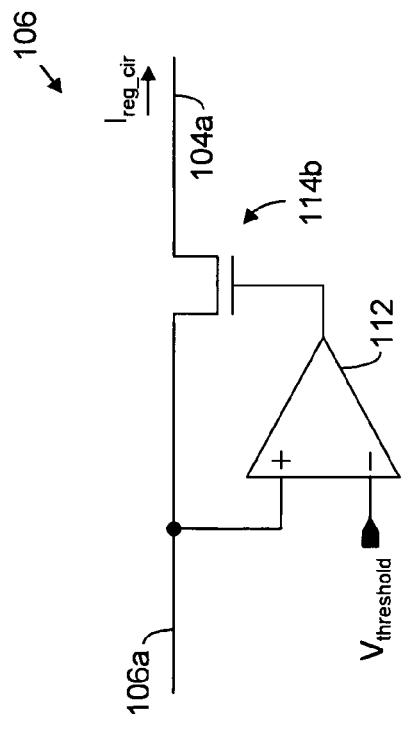

With reference to FIGS. 7C and 7D, sensing circuitry 106 may be implemented using p-channel transistor 114c or n-channel transistor 114d, respectively, having a predetermined reference voltage applied the gate thereof. With reference to FIG. 7C for example, in operation, when the voltage on signal line 106a is equal to or exceeds a threshold voltage (of transistor 114c) greater than reference voltage $Vref_1$, transistor 114c "turns on" and provides a current path from node 108 to current regulation circuitry 104 (which allows current regulation circuitry 104 to sink some or all of the current output or conducted from the memory cell ($I_{bitcell}$)). In one embodiment, the reference voltage $Vref_1$ is equal to or substantially equal to ground or common. Indeed, in one embodiment, the amplitude of the voltage necessary to "turn on" transistor 114b is equal to the amplitude or level of the threshold voltage ($V_{threshold}$) discussed above in connection with the embodiments of FIGS. 7A and 7B.

Notably, depending on the input/output characteristics of transistor 114c and 114d, transistor 114c and 114d may start to conduct current before the voltage on signal line 106a is equal to or exceeds a threshold voltage (i) higher than reference voltage $Vref_1$ for transistor 114c or (ii) lower for transistor 114d than reference voltage $Vref_1$. Indeed, transistor 114c or transistor 114d may be sized, designed and/or fabricated to provide predetermined temporal response characteristics as well as input/output characteristics. For example, the level of body implant may be adjusted to provide adequate control for the conduction threshold of transistor 114c or transistor 114d.

In sum, sensing circuitry 106 may be any circuitry and employ any technique, whether now known or later developed, which senses, detects and/or determines a predetermined voltage on the intrinsic capacitance (capacitor 110 ($C_{bitline}$)) of the bit line and/or a predetermined voltage at node 108, and, in response thereto, electrically couples node 108 (or provides a current path from node 108) to current regulation circuitry 104.

Figure 4C:
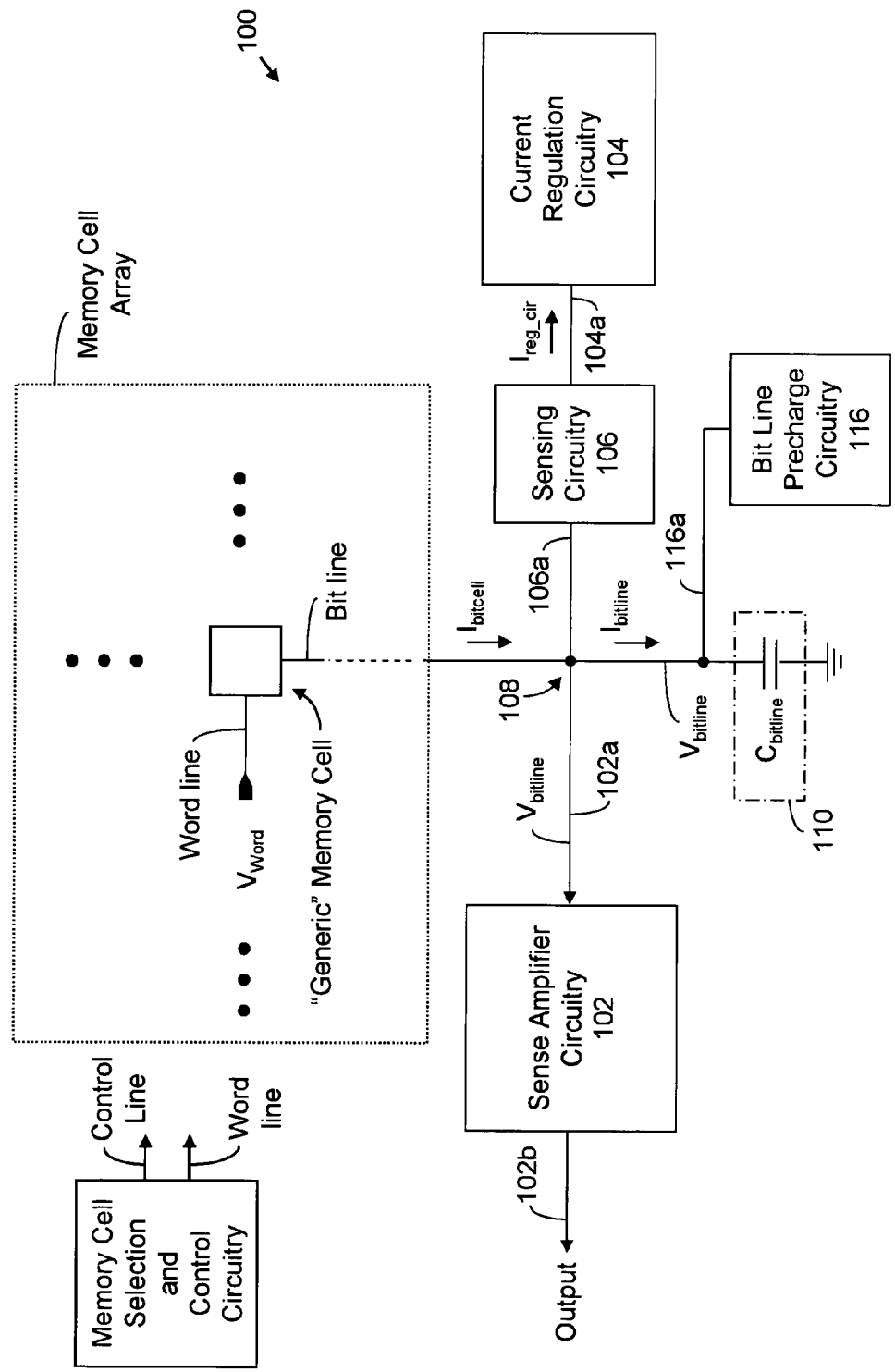
Figure 4D:
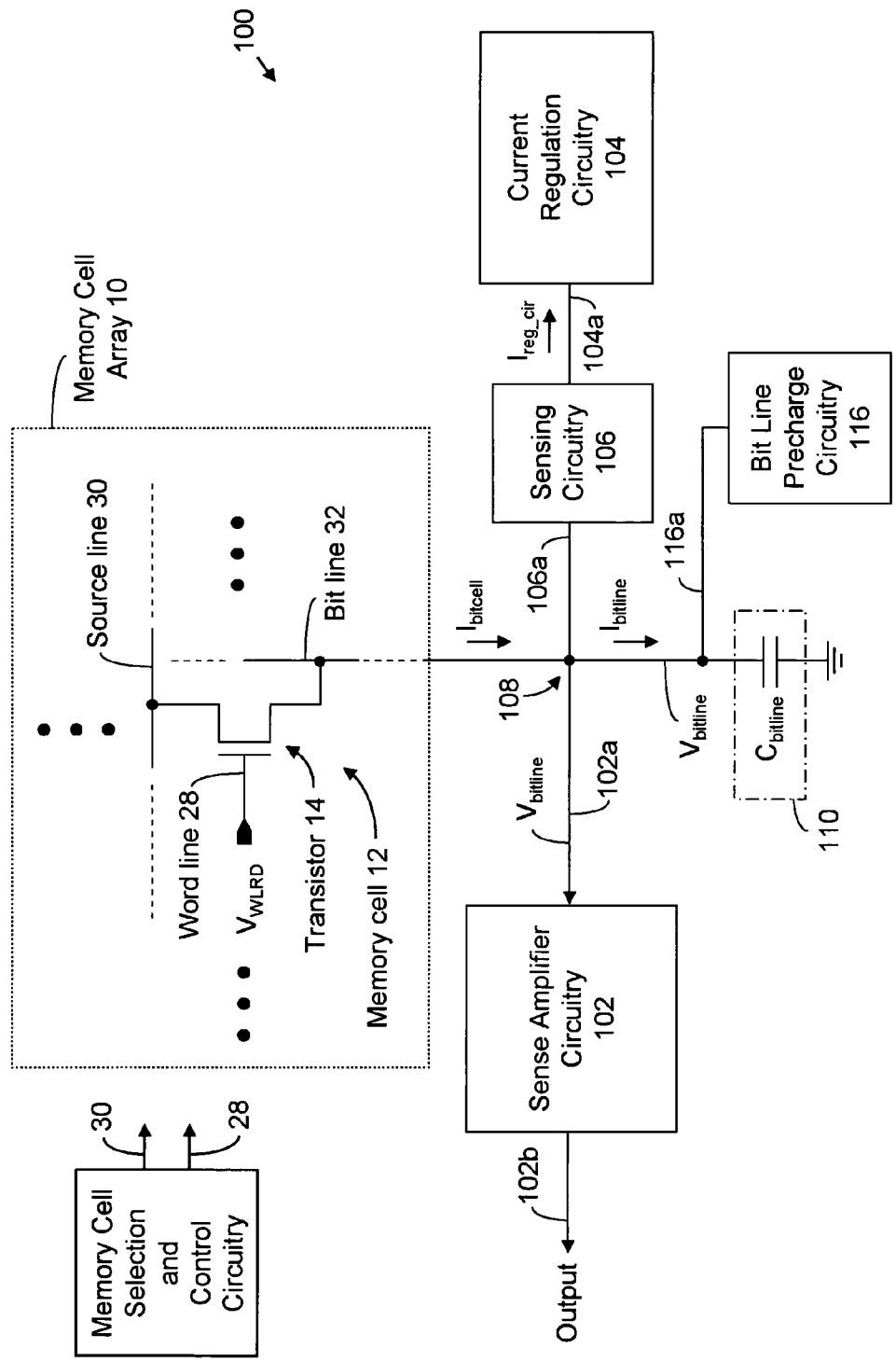
Figure 8A:
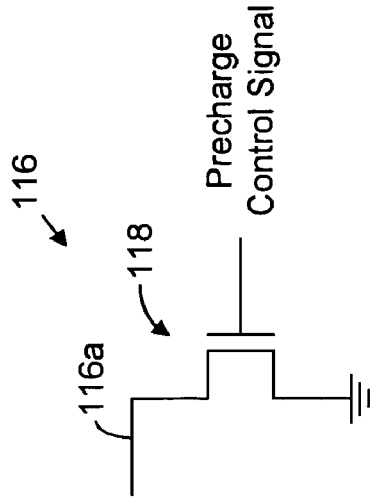
FIGS. 8A and 8B are schematic illustrations of exemplary bit line precharge circuitry of FIGS. 4C and 4D, according to certain aspects and/or embodiments of the present inventions.
Figure 8B:
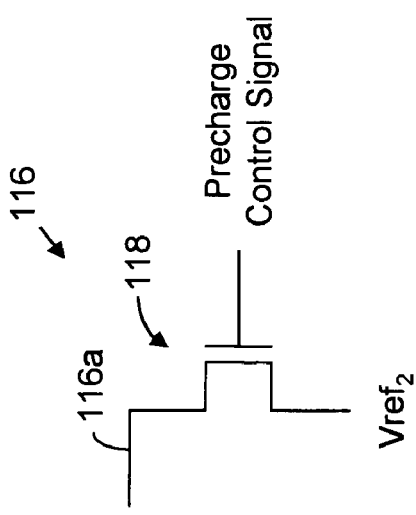
Figure 9:
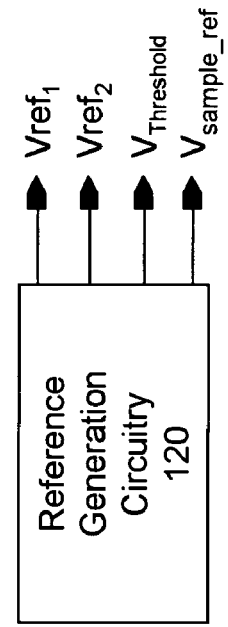
FIG. 9 is a block diagram illustration of exemplary reference voltage generation circuitry to generate one or more reference voltages, according to certain aspects and/or embodiments of the present inventions.

With reference to FIGS. 4C and 4D, read circuitry 100 may further include bit line precharge circuitry 116. In these embodiments, bit line precharge circuitry 116 is connected to the bit line, via signal line 116a, to establish or provide a predetermined condition or state thereon (for example, a predetermined voltage amplitude) at the start of or immediately prior to reading the data state of the memory cell. The bit line precharge circuitry 116 may be any circuitry, whether now known or later developed, which establishes or provides a predetermined condition on the bit line at the start of or prior to reading the data state of the memory cell. For example, in one embodiment, bit line precharge circuitry 116 may include transistor 118 which is controlled via a precharge control signal coupled to the gate thereof. (See, for example, FIG. 8A). In operation, when the precharge control signal is asserted, transistor 118 is enabled and applies voltage $Vref_2$ to the bit line to establish or provide a predetermined condition on the bit line. In contrast, when precharge control signal is not asserted (deasserted), transistor 118 is disabled and essentially presents an open circuit to signal line 114. Notably, Vref$_2$ may be a voltage that is equal to or substantially equal to ground or common. (See, for example, FIG. 8B).

The integrated circuit may include reference generation circuitry 120 to generate or provide one, some or all of the reference voltages and/or reference currents employed herein. Such circuitry is well known to those skilled in the art.

In operation, with reference to FIGS. 4C, 4D, 5A, 6A, 7C, 8B and 10A, in one exemplary embodiment, read circuitry 100 includes (i) a precharge phase, condition or state wherein certain portions and/or nodes of read circuitry 100 are placed in a predetermined state and (ii) a data sense and sample phase, condition or state wherein the memory cell provides information (for example, a current and/or voltage signal) on the bit line which is read, sensed, sampled, detected and/or determined by sense amplifier circuitry 102. In a precharge condition or state, the precharge control signal is asserted and the bit line is coupled to a reference voltage which, in this embodiment, is ground or common. Shortly before or shortly after the precharge control signal is deasserted, the selection signal(s) is/are applied to the memory cell to select and couple a particular memory cell to the bit line. For example, in FIG. 4D, a suitable memory cell selection signal ($V_{WLRD}$) is applied to the gate of transistor 14, via word line 28. Notably, in certain memory cell architectures, a second temporally varying memory cell selection signal may be applied to the source region of transistor 14 via source line 30.

In the context of the embodiment of FIG. 4D, it may be advantageous to select/enable memory cell 12 prior to the completion or the conclusion of the precharge phase. In this way, the data sense and sample phase of the read operation commences immediately after the precharge control signal is deasserted and transistor 118 is disabled. At this point, in those situations where the selected memory cell stores a logic high data state, the amplitude of the voltage on bit line 32 is "permitted" to increase in response to a current ($I_{bitline}$) which flows on bit line 32 from the selected memory cell 12 (in response to suitable control signals applied to gate of transistor 14, via word line 28, and/or the source region of transistor 14, via source line 30).

Notably, in those situations where sense amplifier circuitry 102 employs the sense amplifier circuitry described and illustrated in U.S. Provisional Patent Application Ser. No. 60/967, 605 (Inventor: Philippe Graber, Filed: Sep. 6, 2007, Title: "Sense Amplifier Circuitry for Integrated Circuit Having Memory Cell Array, and Method of Operating Same"), it may be advantageous to include a suitable time delay between the precharge phase and the data sense and sample phase of the read operation. In this regard, during the delay operation, the various nodes and/or elements of read circuitry 100 and, in particular, various nodes and elements of the particular sense amplifier circuitry, may undergo "settling" before implementation of a read operation. In this way, when read circuitry 100 implements a read operation, optimum, (highly) predetermined, suitable and/or proper conditions may exist which facilitates highly reliable and/or highly repetitive reading, sensing, and/or sampling of the information on bit line.

Figure 10A:
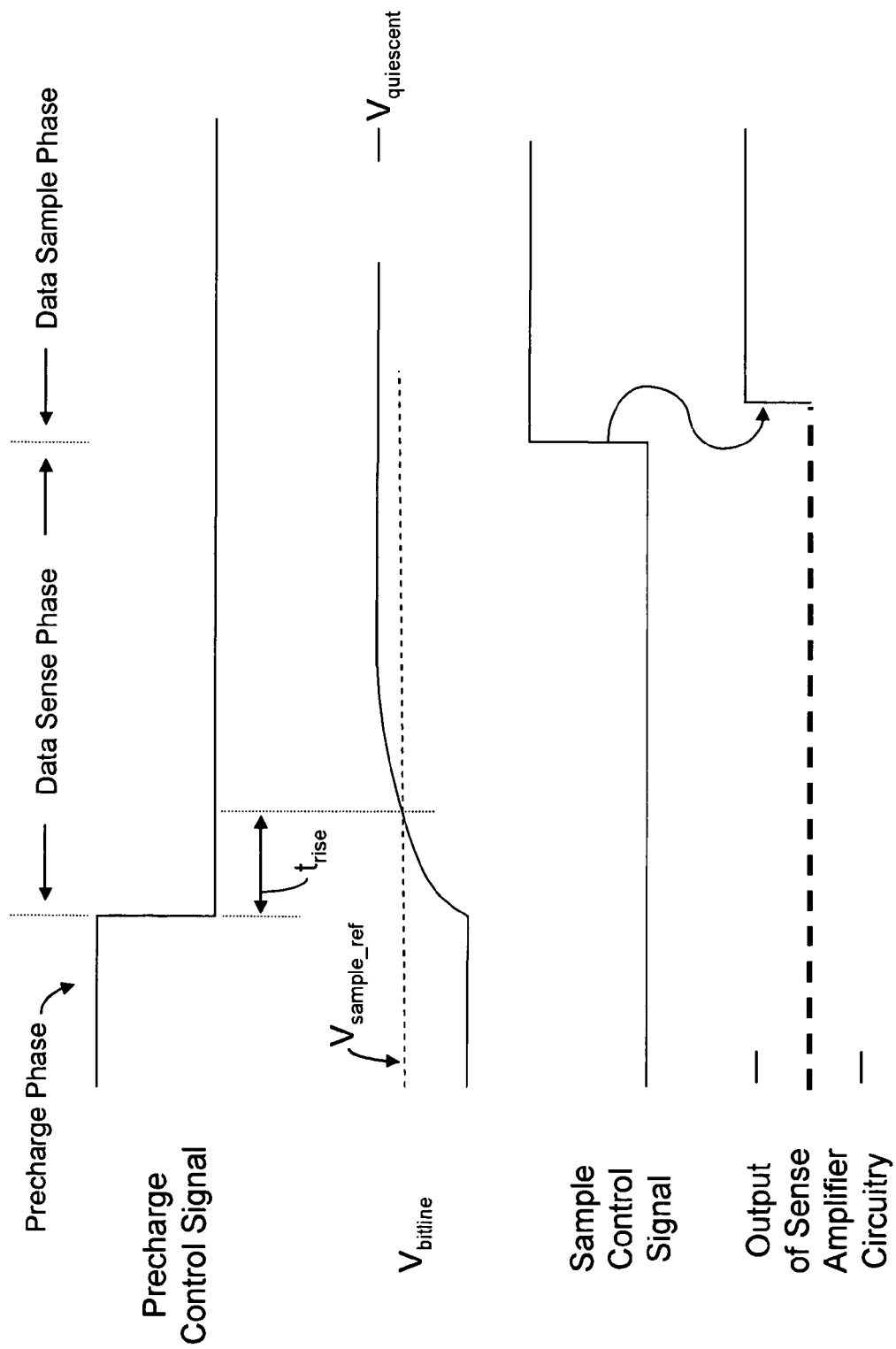
FIG. 10A illustrates an exemplary timing relationship of selected control signals, the amplitude of the voltage applied to an input of the sense amplifier circuitry ($V_{bitline}$), and the output of the sense amplifier circuitry in response to reading, sensing, detecting, sampling and/or determining a logic level high data state stored in the selected memory cell read information coupled to a bit line, according to certain aspects and/or embodiments of the present inventions.
Figure 10B:
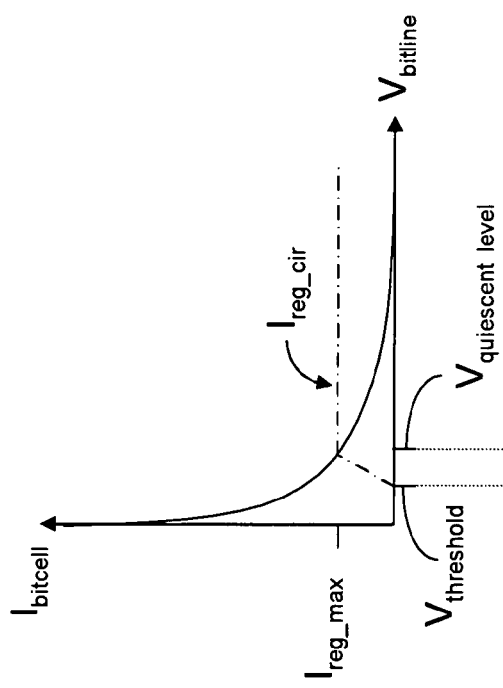
FIG. 10B illustrate exemplary relationships of the amplitude of the current ($I_{bitcell}$) output by a memory cell having a logic level high data state stored therein in relation to (a) the amplitude of the voltage ($V_{bitline}$) developed and/or formed on the bit line in response thereto and (b) the amplitude of the current ($I_{reg\_cir}$) which is sunk by the current regulation circuitry, according to certain aspects and/or embodiments of the present inventions.
Figure 10C:
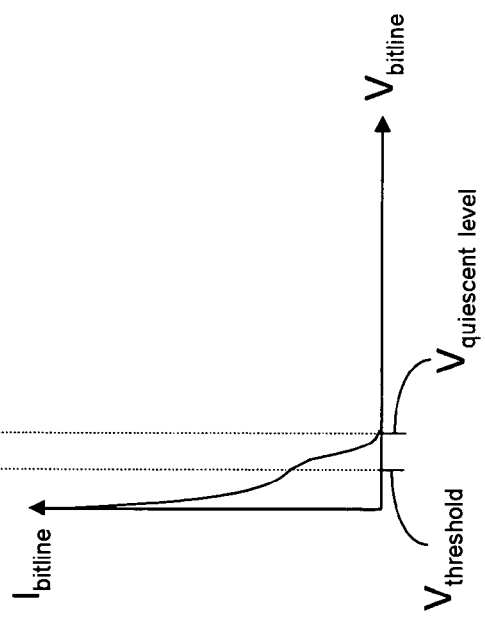
FIG. 10C illustrate exemplary relationships of the amplitude of the current on the bit line ($I_{bitline}$) as a function of or in relation to the amplitude of the voltage ($V_{bitline}$) developed and/or formed on the bit line in response thereto, wherein after the current regulation circuitry is connected to the bit line (via the sensing circuitry) the current on the bit line ($I_{bitline}$) may be characterized as the difference of the current ($I_{bitcell}$) output by a memory cell having a logic level high data state stored therein and the current ($I_{reg\_cir}$) which is sunk by the current regulation circuitry, according to certain aspects and/or embodiments of the present inventions.

With continued reference to FIGS. 4C, 4D, 5A, 6A, 7C, 8B and 10A, in those situations where the selected memory cell stores a logic high data state, current ($I_{bitline}$) flows on the bit line and the voltage on the bit line ($V_{bitline}$) increases (via charge accumulation on the intrinsic capacitance 110 of the bit line ($C_{bitline}$)). When the amplitude of the voltage on the bit line is equal to or exceeds a threshold voltage ($V_{threshold}$) of transistor 114c (in this exemplary embodiment, reference voltage Vref$_1$ is ground or 0 volts), transistor 114c "turns on" and the current regulation circuitry 104 may draw or sink bit line current ($I_{bitline}$) via the current path provided by the sensing circuitry 106. Under these circumstances, current regulation circuitry 104 sinks some or all of the current output or conducted by the memory cell ($I_{bitline}$). Moreover, via connection of current regulation circuitry 104 to the bitline, the rise time of the amplitude of the voltage on the bit line ($V_{bitline}$) is controlled by diversion of current to current regulation circuitry 104. (See, for example, FIGS. 10B and 10C).

Thereafter, the voltage on the bit line attains a quiescent level ($V_{quiescent}$) and sense amplifier circuitry 102 reads, senses, samples, detects and/or determines the voltage on the bit line (which is representative of the logic high data state stored in the selected memory cell) via asserting the control signal, "Sample". In response thereto, sense amplifier circuitry 102 outputs a signal which is representative of the logic high data state stored in the selected memory cell. (See, FIG. 10A).

Notably, in those memory cell array embodiments which employ current regulation techniques, the present inventions may provide a more desired and/or suitable control of the current regulation technique by limiting and/or controlling the timing of when the regulation circuitry 104 draws or sinks bit line current ($I_{bitline}$). That is, in contrast to conventional current regulation technique and/or architectures, the present inventions prevent or inhibit current regulation circuitry 104 from drawing or sinking current from the bitline (and the bitline capacitance) until a predetermined condition exists or is sensed on the bitline and/or until a predetermined time of/in the read operation. For example, in the embodiment of FIG. 7C, before sensing circuitry 106 detects the bit line voltage ($V_{bitline}$) is equal to or exceeds a threshold voltage (of transistor 114c) greater than reference voltage Vref$_1$, current regulation circuitry 104 is electrically decoupled from the bit line and, as such, the voltage on the bit line ($V_{bitline}$) rapidly increases via charge accumulation on the intrinsic capacitance 110 of the bit line ($C_{bitline}$). When the predetermined condition exists or is sensed on the bitline and/or after a predetermined time of/in the read operation, sensing circuitry 106 electrically couples current regulation circuitry 104 to the bit line, which allows current regulation circuitry 104 to sink some or all of the current output from or conducted by the memory cell ($I_{bitline}$)). As such, in the present inventions, when reading a logic high data state, the rise time ($t_{rise}$) of the amplitude of the voltage on the bit line ($V_{bitline}$) is increased (relative to conventional current regulation techniques/architectures) and the detection threshold ($V_{sample\_ref}$) of sense amplifier circuitry 102 is attained and exceeded earlier (relative to conventional current regulation techniques/architectures).

With reference to FIGS. 4D, 5A, 6A, 7C, 8B and 10A, in the event that the selected memory cell stores a logic low data state, the selected memory cell provides or conducts little to no current ($I_{bitline}$) (or an insufficient amount of current ($I_{bitline}$)) on the bit line. Thus, the voltage on the bit line ($V_{bitline}$) does not sufficiently increase to "turn on" transistor 114c and, as such, sensing circuitry 106 does not couple current regulation circuitry 104 to node 108 to allow circuitry 104 to sink or draw some or all of the bit line current ($I_{bitline}$). Moreover, the amplitude of the voltage on the bit line does not attain or exceed the reference voltage level ($V_{sample\_ref}$) applied to sense amplifier circuitry 102 and/or a quiescent level ($V_{quiescent}$). As such, sense amplifier circuitry 102 responsively reads, senses, samples, detects and/or determines a logic low data state, as well as outputs data which is representative of that logic low data state.

Notably, in those embodiments where read circuitry 100 does not include bit line precharge circuitry 116, the operation is similar to that discussed above except that the read operation does not include a precharge phase. For the sake of brevity the discussion the data sense and sample phase of the read operation wherein the memory cell provides information (for example, a current and/or voltage signal) on the bit line which is read, sensed, sampled, detected and/or determined by sense amplifier circuitry 102.

As illustrated, the integrated circuit of the present inventions further includes memory cell selection and control circuitry. (See, FIGS. 4A-4D). Briefly, memory cell selection and control circuitry selects or enables one or more memory cells (for example, memory cells 12 of FIGS. 4B and 4D) to facilitate reading data therefrom and/or writing data thereto by, depending on the type of memory cell, applying one or more control signals on one or more word lines and/or control lines (see, FIGS. 4A and 4C) and/or applying one or more control signals on one or more word lines and/or source lines (see, FIGS. 4B and 4D). The memory cell selection and control circuitry may generate such control signals using address data, for example, row address data. Indeed, memory cell selection and control circuitry may include a conventional word line decoders, source line decoders, word line drivers and/or source line drivers. There are many different control/selection techniques (and circuitry therefor) to implement the memory cell selection technique. All such control/selection techniques, and circuitry therefor, whether now known or later developed, are intended to fall within the scope of the present inventions including those incorporated by reference herein (as discussed above).

Figure 11A:
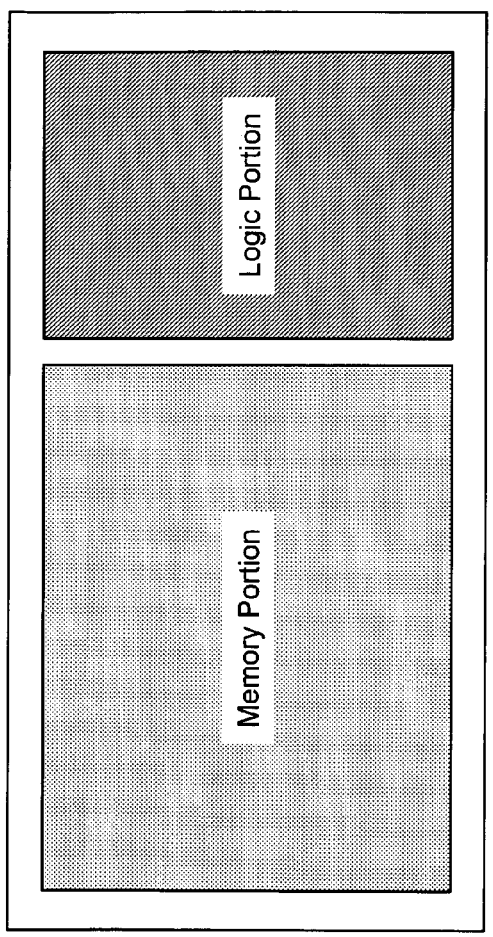
Figure 11B:
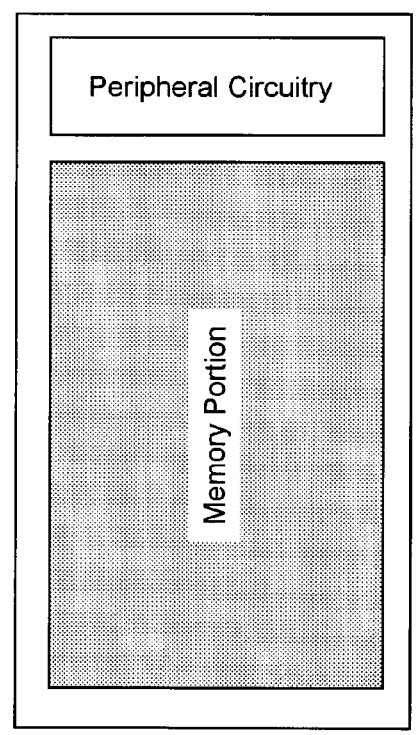
Figure 11C:
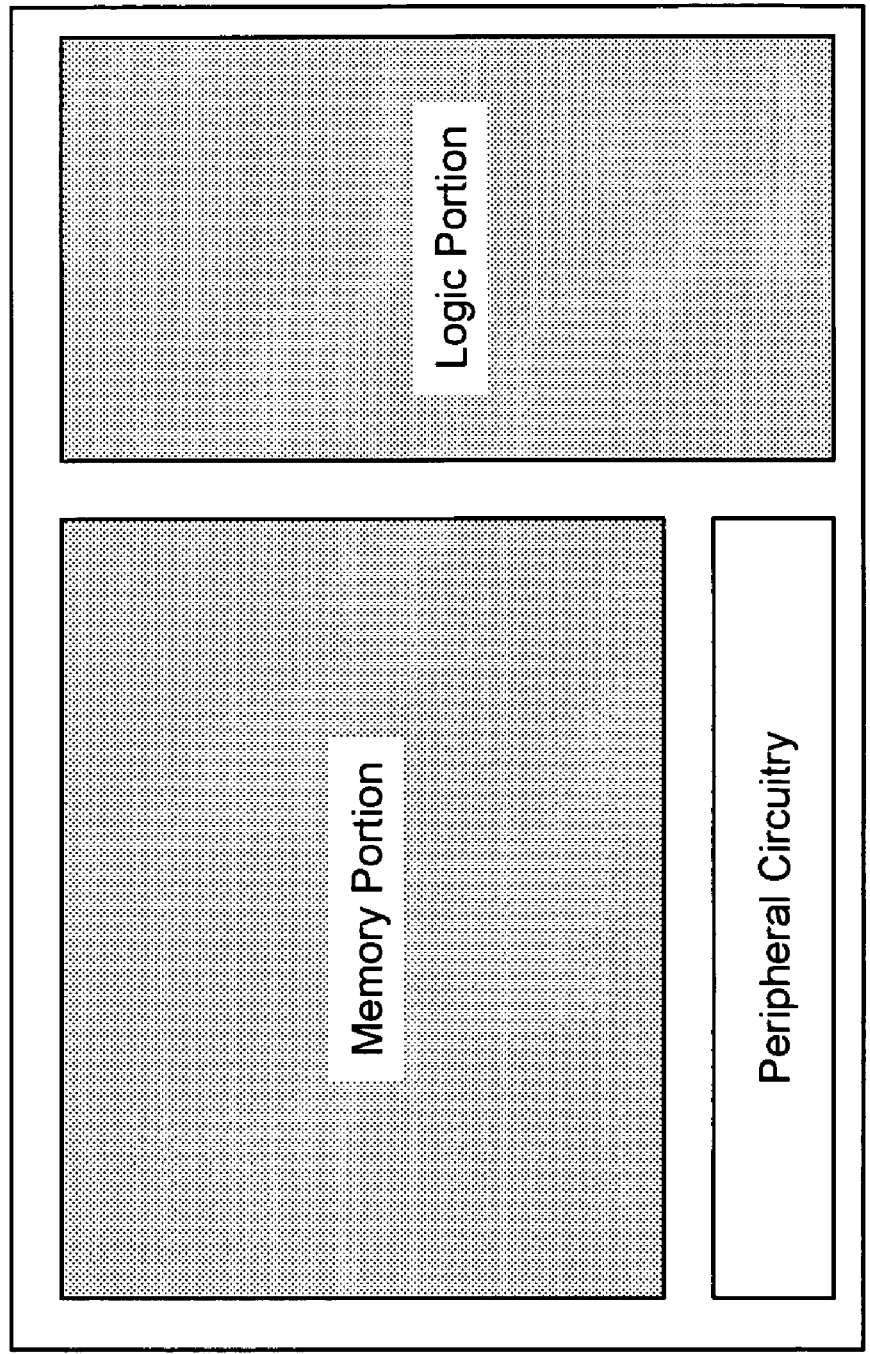

As mentioned above, the present inventions may be implemented in an integrated circuit that is a logic device which includes a memory portion and logic portion (see, for example, FIGS. 11A and 11C), or an integrated circuit that is primarily a memory device (see, for example, FIG. 11B). The logic device may be, for example, a processor, controller, field programmable gate array, state machine, and/or a device including same. Indeed, the present inventions may be implemented in any device employing a memory array and read circuitry.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) U.S. Pat. No. 6,969,662, (2) U.S. Pat. No. 7,301, 838, (3) U.S. Pat. No. 7,301,838, (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"). For example, the memory cell may consist of a PD or a FD SOI or transistor (or transistor formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor. The entire contents of these U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Where N-channel type transistors or P-channel type transistors are employed as memory cells in the memory array(s), suitable write and read voltages are well known to those skilled in the art (and in view of the U.S. Patents and U.S. Patent Applications incorporated herein by reference).

Figure 12A:
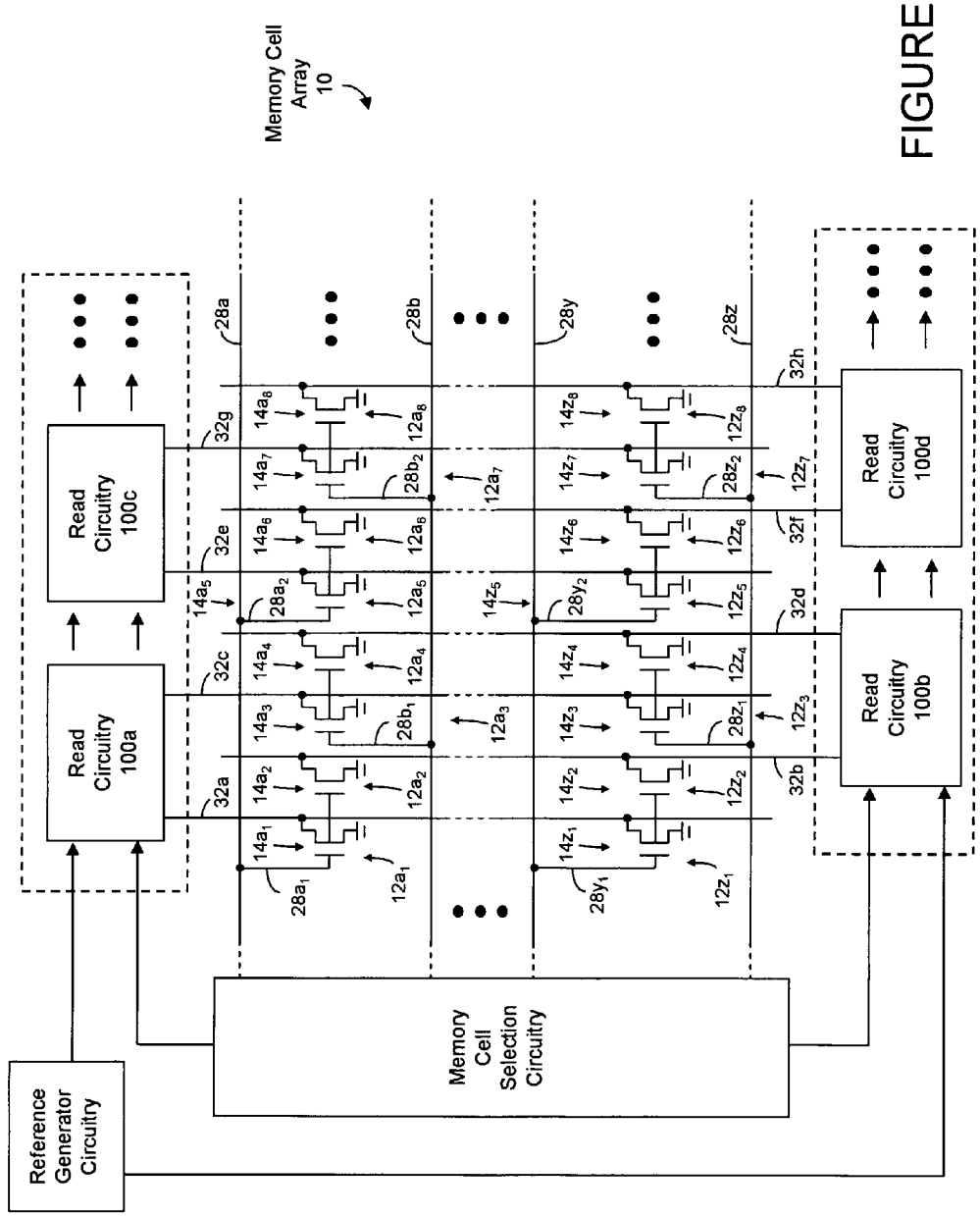
FIGS. 12A and 12B are schematic block diagram illustrations of a portion of an exemplary memory cell array architecture (as described and illustrated in U.S. Patent Application Publication No. 2007/0241405, by Popoff, ("Semiconductor Memory Array Architecture, and Method of Controlling Same") in conjunction with sense amplifier circuitry, wherein the adjacent bit lines are connected to different sense amplifier circuitry.
Figure 12B:
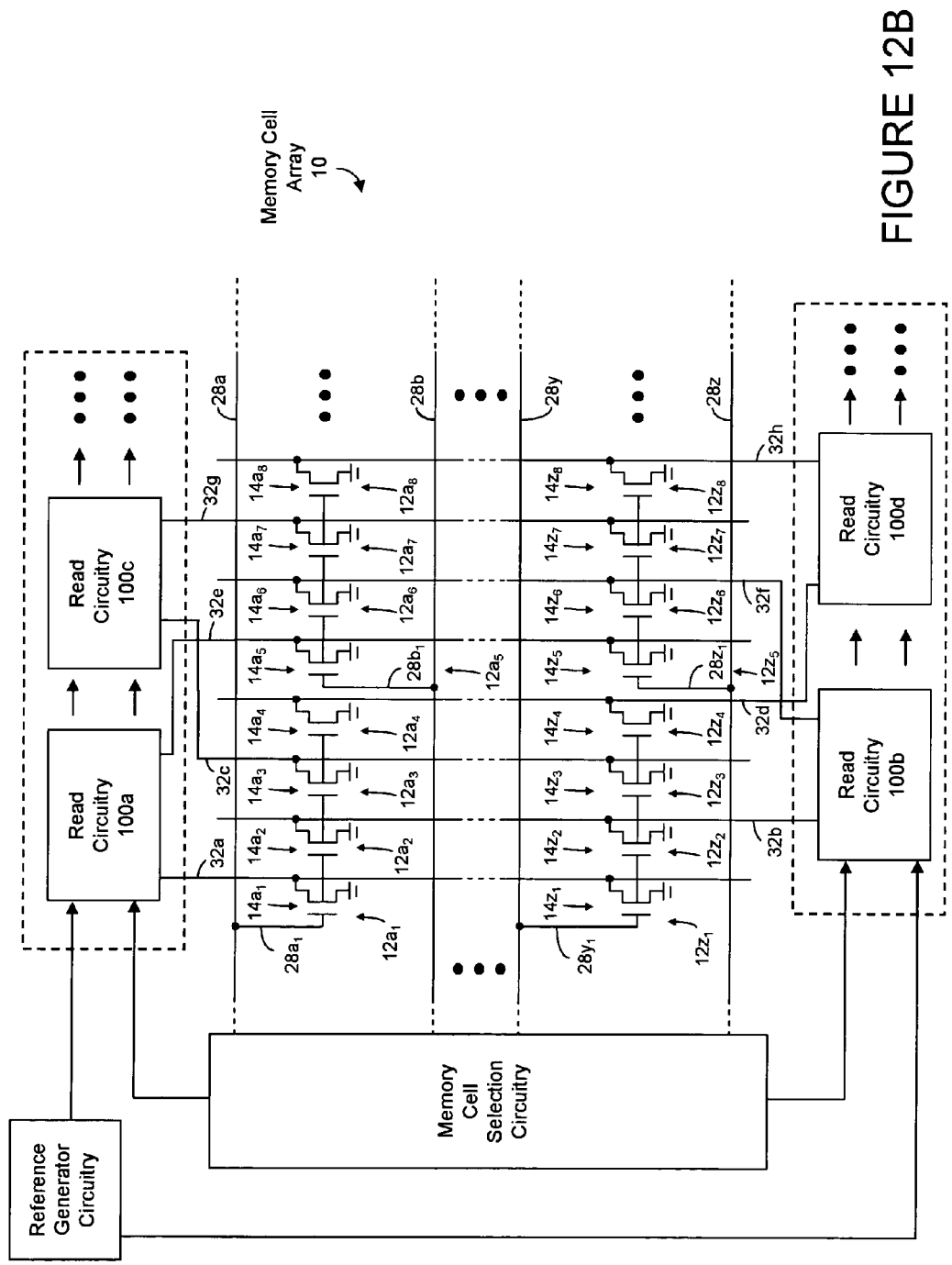

Moreover, the present inventions may be implemented in conjunction with any memory cell array configuration and/or arrangement of the memory cell array. In this regard, integrated circuit device (for example, memory or logic device) may include a plurality of memory cell arrays, each having a plurality of memory cells, wherein the read circuitry of the present invention may be shared between a plurality of memory cell arrays or dedicated to one memory cell array. For example, the present inventions may be employed in any architecture or layout and/or technique of sensing data from memory cells of a memory cell array. For example, read circuitry 100 may be employed in the architectures, circuitry and techniques described and illustrated in U.S. Patent Application Publication No. 2007/0241405, by Popoff, ("Semiconductor Memory Array Architecture, and Method of Controlling Same"), the application being incorporated herein by reference in its entirety. Briefly, with reference to FIGS. 12A and 12B, in one embodiment, reading and programming circuitry includes read circuitry 100a which may be selectively coupled to bit lines 32a and 32c, and read circuitry 100b coupled to bit lines 32b and 32d. In a read operation, one of the bit lines (i.e., the active bit line) is selectively connected to the data sense circuitry in order to sense the data state stored in a memory cell and/or write a data state into a memory cell which is associated with the selected bit line. For example, during a read operation, one of the bit lines 32a and 32c is connected to read circuitry 100a. Similarly, one of the bit lines 32b and 32d is connected to read circuitry 100b.

Figure 13:
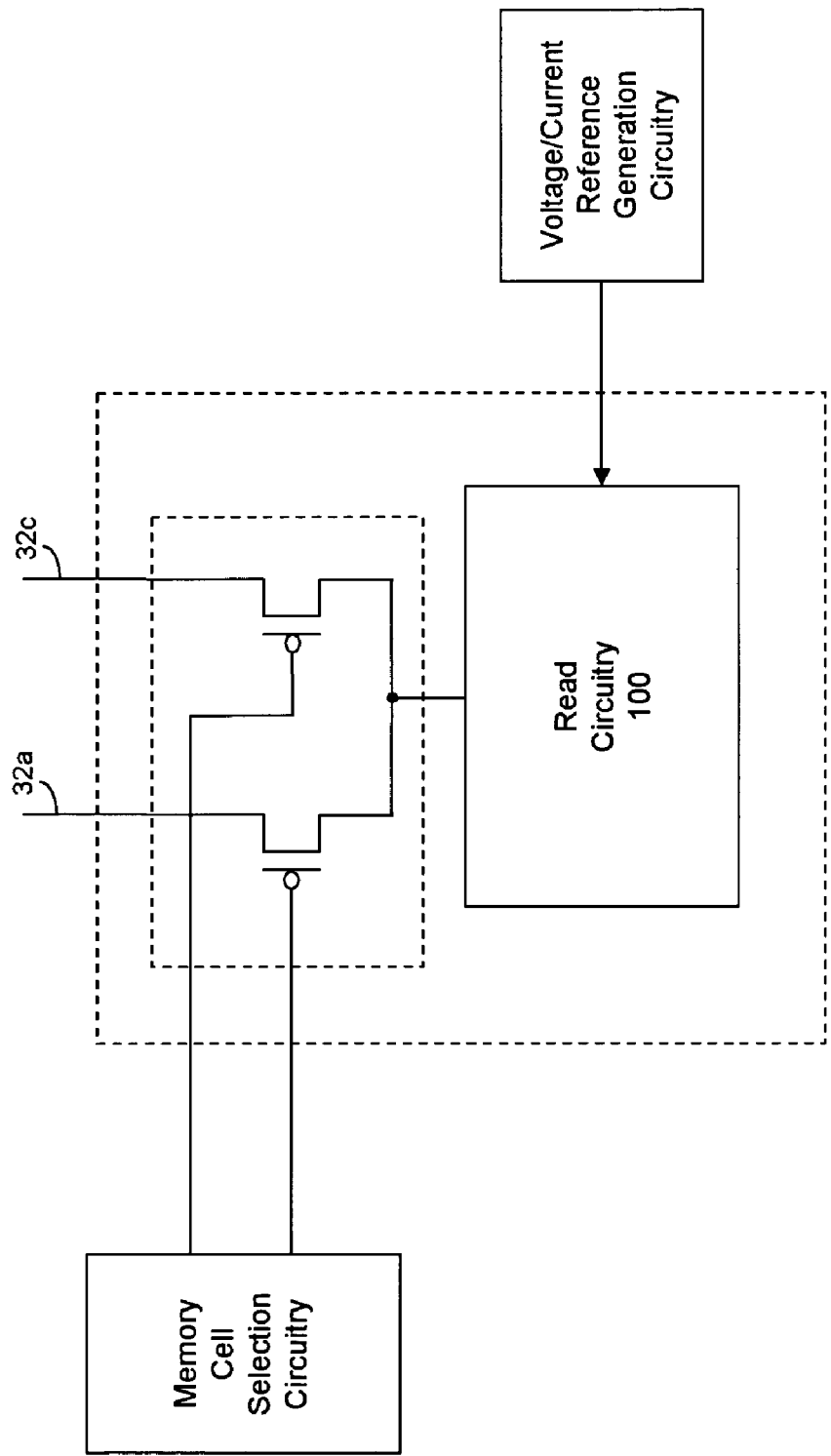
FIG. 13 is a schematic block diagram illustration of an exemplary embodiment of the bit line selection circuit, in conjunction with read circuitry of the present inventions, and certain peripheral circuitry (i.e., reference generation circuitry and memory cell selection circuitry)

With reference to FIG. 13, in one embodiment, the active bit line is selected by memory cell selection circuitry using, for example, one or more bits of the row address (for example, the MSB or LSB). Notably, the other bit line is disconnected from the read circuitry 100. Again, the architectures, circuitry and/or techniques described and illustrated in U.S. Non-Provisional patent application Ser. No. 11/787,718 are incorporated by reference herein.

Further, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following U.S. Patent Applications:

(1) Application Ser. No. 10/450,238, which was filed by Fazan et al. on Jun. 10, 2003 and entitled "Semiconductor Device" (now U.S. Pat. No. 6,969,662);

(2) Application Ser. No. 10/487,157, which was filed by Fazan et al. on Feb. 18, 2004 and entitled "Semiconductor Device" (now U.S. Pat. No. 7,061,050);

(3) Application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) Application Ser. No. 11/079,590, which was filed by Ferrant et al. and entitled "Semiconductor Memory Device and Method of Operating Same" (now U.S. Pat. No. 7,187,581); and (5) Application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298).

Notably, the present inventions may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in U.S. Pat. No. 7,335,934, by Fazan, ("Integrated Circuit Device, and Method of Fabricating Same") and/or U.S. Patent Application Publication No. 2007/0085140, by Bassin, ("One Transistor Memory Cell having a Strained Electrically Floating Body Region, and Method of Operating Same") (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, in one embodiment, an integrated circuit device includes memory section (having a plurality of memory cells, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors)). Moreover, as noted above, the memory cell and/or memory cell array, as well as the circuitry of the present inventions may be implemented in an integrated circuit device having a memory portion and a logic portion (see, for example, FIGS. 11A and 11C), or an integrated circuit device that is primarily a memory device (see, for example, FIG. 11B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

For example, the read circuitry according to certain aspects of the present inventions may be implemented in conjunction with one or more circuits (for example, one or more drivers, inverters and/or latches) to, for example, more fully establish, obtain/provide a predetermined or proper polarity of, and/or maintain the data read, sensed, sampled and/or determined by sense amplifier circuitry 102 during the read/data sense operation and output on signal line 102b. (See, for example, FIGS. 4A-4D, 5A and 5B).

Further, read circuitry of the present inventions may employ any of the configurations of the sense amplifier circuitry, sensing circuitry, current regulation circuitry and bit line precharge circuitry described, incorporated by reference and/or illustrated herein. All permutations and combinations of configurations for read circuitry are intended to fall within the scope of the present inventions. Moreover, all permutations and combinations of configurations of the read circuitry may be implemented in conjunction with any of the memory cells, memory cell technologies, memory cell array architectures and memory types described, incorporated by reference and/or illustrated herein. For the sake of brevity all permutations and combinations will not be discussed in detail but are intended to fall within the scope of the present inventions.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

The exemplary embodiments above included an architecture wherein current regulation circuitry 104 draws or sinks current after sensing circuitry 106 senses, detects and/or determines a predetermined condition exists or is sensed on the bit line and/or until a predetermined time of/in the read operation. (See, for example, FIGS. 4A-4D and 7A-7C). In another exemplary embodiment, the present inventions prevent or inhibit current regulation circuitry 104 from providing or sourcing current to the bit line (and the bit line capacitance) until sensing circuitry 106 senses, detects and/or determines a predetermined condition exists or is sensed on the bit line and/or until a predetermined time of/in the read operation. (See, for example, FIGS. 7D, 14A and 14B). In this regard, transistor 114d turns "on" upon sensing, detecting and/or determining a predetermined condition exists or is sensed on the bit line (for example, the amplitude of the bit line voltage falls one threshold voltage below the reference voltage of $Vref_1$). Thus, the present inventions may be implemented in those instances where (i) current regulation circuitry 104 draws or sinks current during the read operation or (ii) current regulation circuitry 104 provides or sources current during the read operation.

Figure 14A:
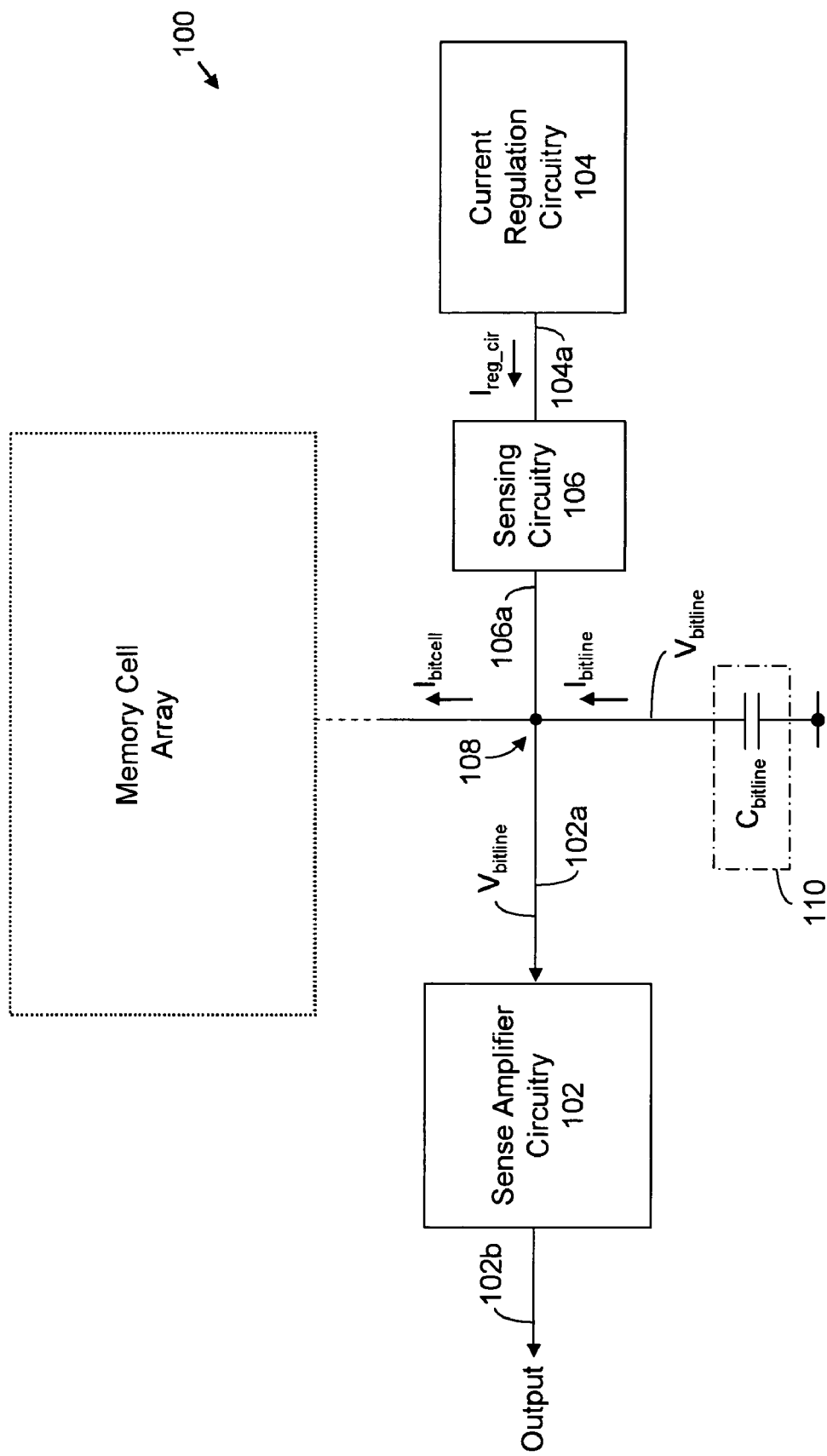
FIGS. 14A and 14B are schematic block diagram illustrations of exemplary read circuitry, according to certain aspects and/or embodiments of the present inventions, wherein the memory cell array may include generic memory cells and/or specific memory cells which includes an electrically floating body transistor (wherein the data state is stored in the electrically floating body region) and the memory cell array including a plurality of such memory cells.
Figure 14B:
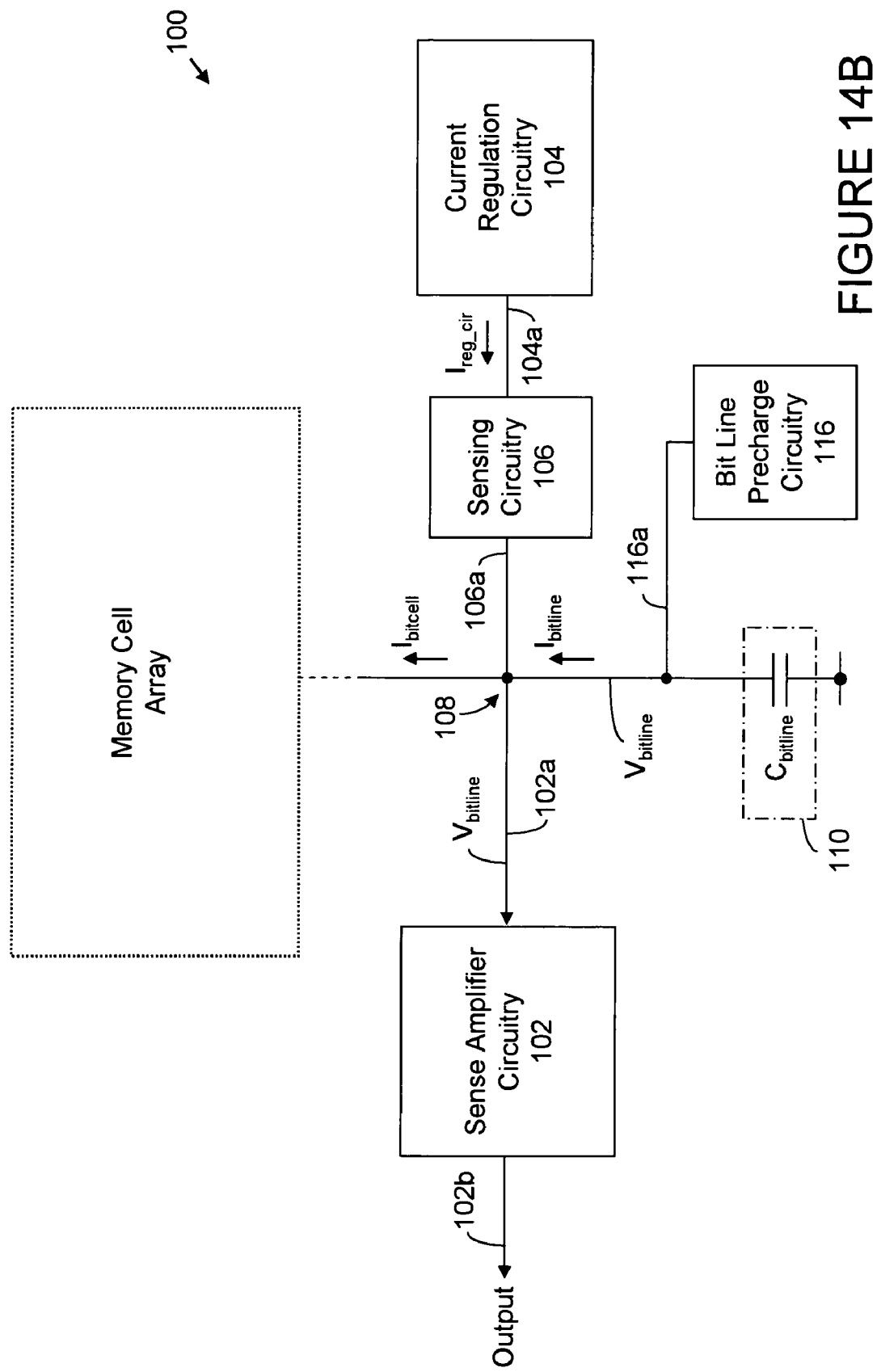

Notably, the operation of exemplary read circuitry 100 of the embodiment of FIGS. 14A and 14B is similar to that described above with respect to, for example, the embodiments of FIGS. 4A-4D except current regulation circuitry 104 provides or sources current during the read operation rather than draws or sinks current during the read operation (as discussed above). Briefly, during implementation of the read operation, the current conducted by the memory cell (i.e., $I_{bitcell}$), or a portion thereof, is supplied through node 108. Where the selected memory cell stores a predetermined logic state (for example, a high data state), a portion or all of the current (i.e., $I_{bitcell}$) discharges the intrinsic capacitance of the bit line, which is represented by capacitor 110 ($C_{bitline}$). In addition, once the amplitude of the voltage on the bit line ($V_{bitline}$) is at or below a predetermined value, a portion of the current conducted by the memory cell (i.e., $I_{bitcell}$) is sourced or provided by current regulation circuitry 104 (i.e., $I_{reg\_cir}$). The sense amplifier 102 employs the voltage on signal line 102a ($V_{bitline}$) to read, sense, sample, detect and/or determine the data state stored in memory cell coupled to the bit line (for example, memory cell 12 coupled to bit line 32). Thus, in the illustrated embodiment, a voltage signal is employed to determine the state of the memory cell.

In the event that the selected memory cell stores a different logic state (for example, a logic low data state), the selected memory cell conducts little to no current ($I_{bitcell}$) (or an insufficient amount of current ($I_{bitcell}$)) from the bit line. Thus, the voltage on the bit line ($V_{bitline}$) does not sufficiently decrease to "turn on" transistor 114c and, as such, sensing circuitry 106 does not couple current regulation circuitry 104 to node 108 to allow circuitry 104 to source or provide some or all of the bit line current ($I_{bitcell}$). Moreover, the amplitude of the voltage on the bit line does not decrease below the reference voltage level ($V_{sample\_ref}$) applied to sense amplifier circuitry 102 and/or a quiescent level ($V_{quiescent}$). As such, sense amplifier circuitry 102 responsively reads, senses, samples, detects and/or determines, in this example, a logic low data state, as well as outputs data which is representative of that logic low data state.

In the embodiment of FIGS. 7D, 14A and 14B, it may be advantageous to employ a $Vref_1$ that is equal to the positive supply value. Moreover, the amplitude of the voltage on the bit line is "referenced" to the positive supply (for example, the precharge voltage). In this way, for example, transistor 114d turns "on" upon sensing, detecting and/or determining a predetermined condition exists or is sensed on the bit line (for example, the amplitude of the bit line voltage falls one threshold voltage below the reference voltage of $Vref_1$ of the positive supply. Indeed, sensing circuitry 106 may include or employ any of the embodiments described and illustrated herein.

Notably, although generally described herein as DC reference signals (for example, ground or supply) the reference potential may be AC and/or DC signals.

In this document, the term "circuit" may mean, among other things, a single component (for example, electrical/electronic) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form. The term "to sense a/the data state stored in memory cell" means, among other things, to sample, to sense, to read and/or to determine a/the data state stored in memory cell; "sensing a/the data state stored in memory cell", "sensed a/the data state stored in memory cell" or the like shall have the same meaning.

What is claimed is:

1. An integrated circuit device comprising:
 a memory cell array including:
  a plurality of memory cells wherein each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor;
  a bit line having an intrinsic capacitance, wherein a plurality of the memory cells are coupled to the bit line;
 memory cell control circuitry, coupled to the memory cell array, to generate one or more read control signals to perform a read operation wherein, in response to the one or more read control signals, the electrically floating body transistor associated with a selected memory cell conducts a current, which is representative of the data state stored in the selected memory cell, on the bit line;
 sense amplifier circuitry having an input which is electrically coupled to the bit line to receive a signal which is responsive to the current conducted on the bit line by the electrically floating body transistor of the selected memory cell and, in response thereto, to (i) sense the data state stored in the selected memory cell and (ii) output a signal which is representative thereof;
 current regulation circuitry, electrically coupled to the bit line, to sink or source at least a portion of the current conducted on the bit line by the electrically floating body transistor of the selected memory cell during only a portion of the read operation; and
 sensing circuitry, coupled between the bit line and the current regulation circuitry, to responsively couple the current regulation circuitry to the bit line during only the portion of the read operation.

2. The integrated circuit device of claim 1 wherein the sensing circuitry includes a transistor, wherein the transistor provides a current path between the bit line and the current regulation circuitry in response to a predetermined voltage on the bit line.

3. The integrated circuit device of claim 2 wherein the transistor is a p-channel or n-channel type transistor.

4. The integrated circuit device of claim 1 wherein the sensing circuitry includes a switch which provides a current path between the bit line and the current regulation circuitry in response to a predetermined voltage on the bit line.

5. The integrated circuit device of claim 1 wherein the sense amplifier circuitry senses the data state of the selected memory cell using an amplitude of the voltage on the bit line.

6. The integrated circuit device of claim 5 wherein the amplitude of the voltage on the bit line is responsive to the amount of current on the bit line conducted by the electrically floating body transistor associated with the selected memory cell during the read operation.

7. The integrated circuit device of claim 1 wherein the current regulation circuitry includes a current mirror circuit.

8. The integrated circuit device of claim 1 wherein the portion of the read operation includes the end of the read operation.

9. The integrated circuit device of claim 1 wherein the electrically floating body transistor associated with the selected memory cell conducts a channel current which is representative of the data state of the memory cell on the bit line.

10. The integrated circuit device of claim 1 wherein the electrically floating body transistor associated with the selected memory cell conducts a bipolar transistor current which is representative of the data state of the memory cell on the bit line.

11. An integrated circuit device comprising:
   a memory cell array including:
      a plurality of memory cells arranged in a matrix of rows and columns, wherein each memory cell is programmable to store one of a plurality of data states;
      a bit line having an intrinsic capacitance, wherein a plurality of the memory cells are coupled to the bit line;
   memory cell control circuitry, coupled to the memory cell array, to generate one or more read control signals to perform a read operation wherein, in response to the one or more read control signals, a selected memory cell conducts a current, which is representative of the data state stored in the selected memory cell, on the bit line;
   sense amplifier circuitry having an input which is electrically coupled to the bit line to receive a signal which is responsive to the current conducted on the bit line, and, in response thereto, to (i) sense the data state stored in the selected memory cell and (ii) output a signal which is representative thereof;
   current regulation circuitry, electrically coupled to the bit line, to sink or source at least a portion of the current conducted on the bit line by the selected memory cell during only a portion of the read operation; and
   sensing circuitry, coupled between the bit line and the current regulation circuitry, to responsively couple the current regulation circuitry to the bit line during only the portion of the read operation.

12. The integrated circuit device of claim 11 wherein the sensing circuitry includes a transistor, wherein the transistor provides a current path between the bit line and the current regulation circuitry in response to a predetermined voltage on the bit line.

13. The integrated circuit device of claim 12 wherein the transistor is a p-channel or n-channel type transistor.

14. The integrated circuit device of claim 11 wherein the sensing circuitry includes a switch which provides a current path between the bit line and the current regulation circuitry in response to a predetermined voltage on the bit line.

15. The integrated circuit device of claim 11 wherein the sense amplifier circuitry senses the data state of the selected memory cell using an amplitude of the voltage on the bit line.

16. The integrated circuit device of claim 15 wherein the amplitude of the voltage on the bit line is responsive to the amount of current on the bit line conducted by an electrically floating body transistor associated with the selected memory cell during the read operation.

17. The integrated circuit device of claim 11 wherein the current regulation circuitry includes a current mirror circuit.

18. The integrated circuit device of claim 11 wherein the portion of the read operation includes the end of the read operation.

19. An integrated circuit device comprising:
   a memory cell array including:
      a plurality of memory cells wherein each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor;
      a bit line having an intrinsic capacitance, wherein a plurality of the memory cells are coupled to the bit line;
   means for generating one or more read control signals to perform a read operation wherein, in response to the one or more read control signals, the electrically floating body transistor associated with a selected memory cell conducts a current, which is representative of the data state stored in the selected memory cell, on the bit line;
   means for receiving a signal which is responsive to the current conducted on the bit line by the electrically floating body transistor of the selected memory cell and, in response thereto, for (i) sensing the data state stored in the selected memory cell and (ii) outputting a signal which is representative thereof;
   current regulation means for sinking or sourcing at least a portion of the current conducted on the bit line by the electrically floating body transistor of the selected memory cell during only a portion of the read operation; and
   means for responsively and electrically coupling the current regulation means to the bit line during only the portion of the read operation.

20. A method of reading a memory cell which is disposed on integrated circuit device comprising a memory cell array including a plurality of memory cells arranged in a matrix of rows and columns, wherein the memory cell array includes a plurality of memory cells wherein each memory cell includes an electrically floating body transistor including a body region which is electrically floating, wherein each memory cell is programmable to store one of a plurality of data states including (i) a first data state representative of a first charge in the body region of the transistor, and (ii) a second data state representative of a second charge in the body region of the transistor, the method comprising:
   generating read control signals to perform a read operation wherein, in response to read control signals, the electrically floating body transistor associated of a selected memory cell conducts a current which is representative of the data state of the memory cell on a bit line;
   determining the data state stored in the selected memory cell using a signal which is responsive to the current conducted by the electrically floating body transistor and, in response thereto, outputting a data state signal which is representative of the data state of the memory cell on the bit line;

sinking or sourcing at least a portion of the current conducted on the bit line by the electrically floating body transistor of the selected memory cell during only a portion of the read operation; and sensing a predetermined voltage on the bit line, wherein sinking or sourcing at least a portion of the current conducted on the bit line further includes sinking or sourcing a substantial portion of the current conducted on the bit line by the electrically floating body transistor after sensing the predetermined voltage on the bit line.

21. The method of claim 20 wherein portion of the read operation includes the end of the read operation.

22. The method of claim 20 further including providing a current path during only a portion of the read operation to sink or source at least a portion of the current conducted on the bit line by the electrically floating body transistor of the selected memory cell.

23. The method of claim 20 wherein determining the data state stored in the selected memory cell using the signal which is responsive to the current conducted by the electrically floating body transistor further includes using an amplitude of the voltage on the bit line to determine the data state stored in the selected memory cell.

24. The method of claim 20 wherein the amplitude of the voltage on the bit line is responsive to the amount of current conducted on the bit line during the read operation.

* * * * *